(12) United States Patent
Tai et al.

(10) Patent No.: US 11,580,767 B2
(45) Date of Patent: Feb. 14, 2023

(54) FINGERPRINT SENSOR

(71) Applicant: Taiwan Semiconductor Manufacturing Company, Ltd., Hsinchu (TW)

(72) Inventors: Chih-Hsuan Tai, Taipei (TW); Chih-Hua Chen, Hsinchu County (TW); Hao-Yi Tsai, Hsinchu (TW); Yu-Chih Huang, Hsinchu (TW); Chia-Hung Liu, Hsinchu (TW); Ting-Ting Kuo, Hsinchu (TW); Ying-Cheng Tseng, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 167 days.

(21) Appl. No.: 17/017,640

(22) Filed: Sep. 10, 2020

(65) Prior Publication Data
US 2020/0410198 A1    Dec. 31, 2020

Related U.S. Application Data

(63) Continuation of application No. 15/884,287, filed on Jan. 30, 2018, now Pat. No. 10,762,319.

(51) Int. Cl.
*G06K 9/00* (2022.01)
*G06V 40/13* (2022.01)
*H01L 21/70* (2006.01)

(52) U.S. Cl.
CPC ...... *G06V 40/1306* (2022.01); *G06V 40/1329* (2022.01); *H01L 21/70* (2013.01)

(58) Field of Classification Search
CPC ..................................................... H01L 21/70
See application file for complete search history.

(56) References Cited

U.S. PATENT DOCUMENTS

| | | | |
|---|---|---|---|
| 6,060,756 A * | 5/2000 | Machida | G01B 7/34 257/415 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |

(Continued)

*Primary Examiner* — Hadi Akhavannik
(74) *Attorney, Agent, or Firm* — JCIPRNET

(57) ABSTRACT

A fingerprint sensor includes a die, a plurality of conductive structures, an encapsulant, a plurality of conductive patterns, a first dielectric layer, a second dielectric layer, and a redistribution structure. The die has an active surface and a rear surface opposite to the active surface. The conductive structures surround the die. The encapsulant encapsulates the die and the conductive structures. The conductive patterns are over the die and are electrically connected to the die and the conductive structures. Top surfaces of the conductive patterns are flat. The first dielectric layer is over the die and the encapsulant. A top surface of the first dielectric layer is coplanar with top surfaces of the conductive patterns. The second dielectric layer covers the first dielectric layer and the conductive patterns. The redistribution structure is over the rear surface of the die.

20 Claims, 24 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 | 11/2016 | Yu et al. |
| 2002/0047161 A1* | 4/2002 | Thomas ............. G06V 40/1329 257/355 |
| 2009/0103787 A1* | 4/2009 | Chen .................. G06V 40/1329 382/124 |
| 2016/0300096 A1* | 10/2016 | Kim ................... G06V 40/1306 |
| 2017/0338163 A1* | 11/2017 | Chung ............... G06V 40/1329 |
| 2019/0171857 A1* | 6/2019 | Liu ......................... H01L 24/92 |

* cited by examiner

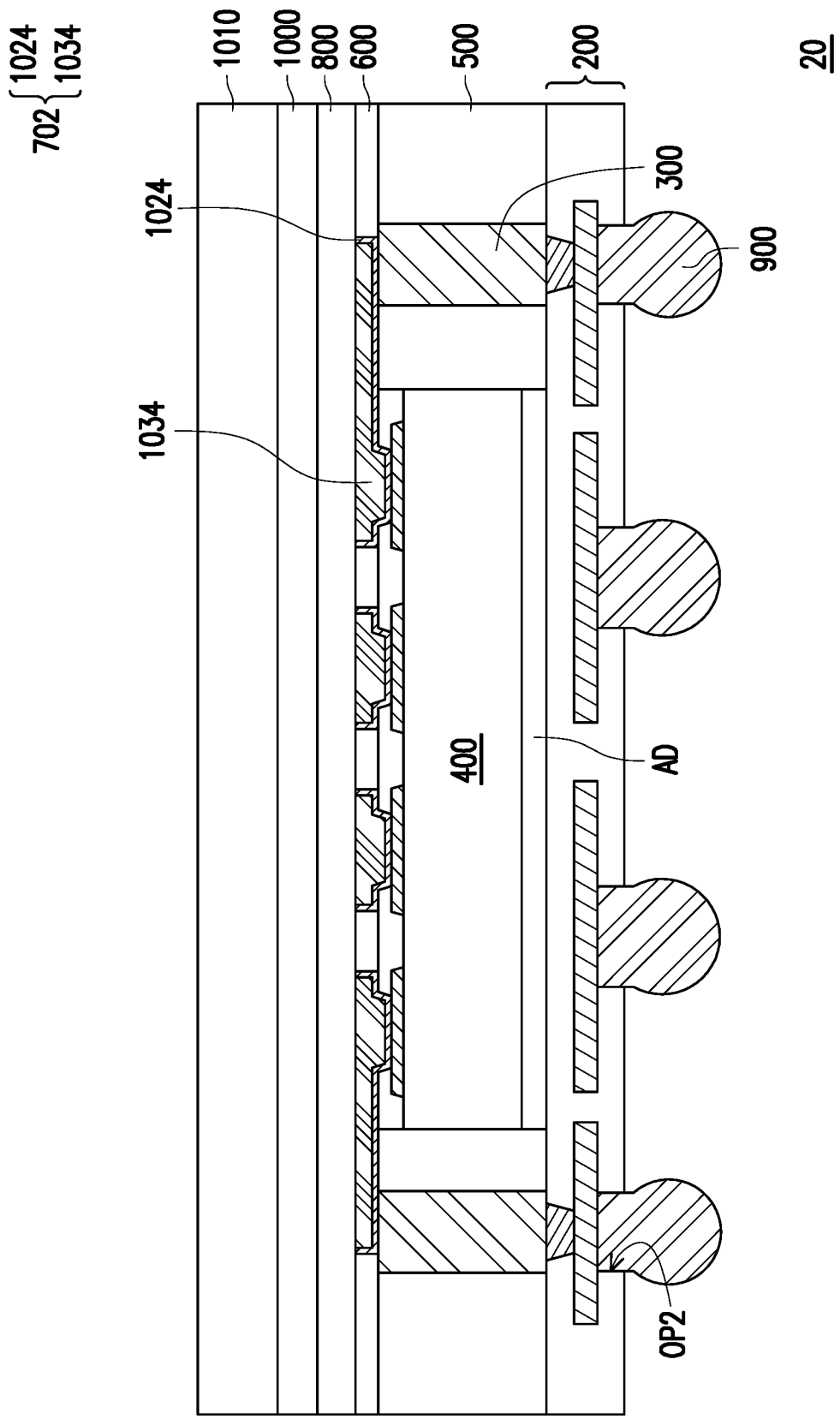

FINGERPRINT SENSOR

CROSS-REFERENCE TO RELATED APPLICATION

This application is a continuation application of and claims the priority benefit of a prior application Ser. No. 15/884,287, filed on Jan. 30, 2018. The entirety of the above-mentioned patent application is hereby incorporated by reference herein and made a part of this specification.

BACKGROUND

Fingerprint recognition systems constitute a widely used approach to identify individuals for scopes as varied as securing information on electronic devices, granting controlled access to restricted areas, or security controls at national borders. Capacitive fingerprint sensors have been developed to detect variations of an electric field generated by the morphology of the friction ridges and the interspersed valleys of a human finger that touches a dedicated surface of the sensor itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2M are cross-sectional views illustrating various stages of a method of manufacturing a fingerprint sensor in accordance with some alternative embodiments of the disclosure.

DETAILED DESCRIPTION

Figure 1A:
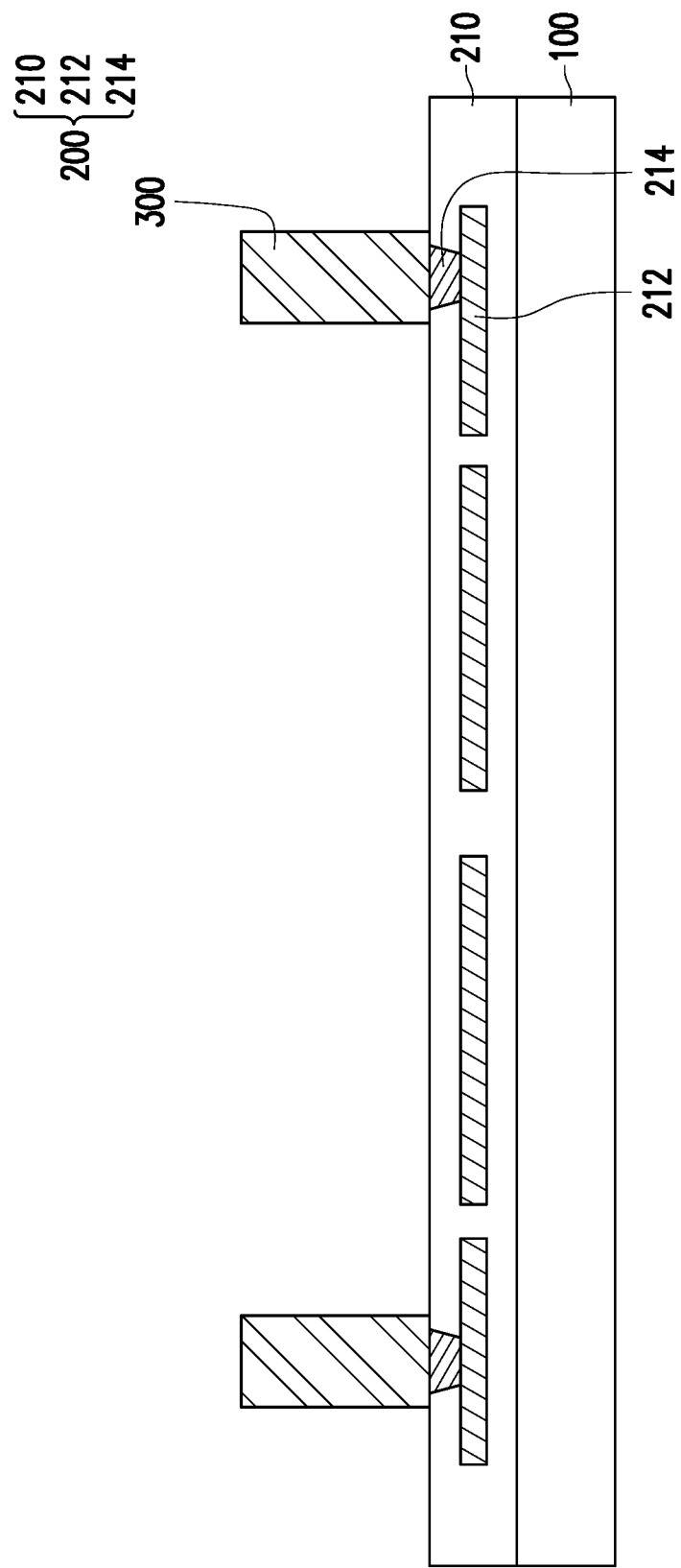
FIG. 1A to FIG. 1K are cross-sectional views illustrating various stages of a method of manufacturing a fingerprint sensor in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are cross-sectional views illustrating various stages of a method of manufacturing a fingerprint sensor 10 in accordance with some embodiments of the disclosure. Referring to FIG. 1A, a carrier 100 having a de-bonding layer (not shown) formed thereon is provided. In some embodiments, the carrier 100 is a glass substrate. However, other material may be adapted as a material of the carrier 100 as long as the material is able to withstand the subsequent processes while carrying the package structure (fingerprint sensor 10) formed thereon. In some embodiments, the de-bonding layer is a light-to-heat conversion (LTHC) release layer formed on the glass substrate. The de-bonding layer allows the structure formed on the carrier 100 in the subsequent processes to be peeled off from the carrier 100.

A redistribution structure 200 is formed over the carrier 100. In some embodiments, the redistribution structure 200 is attached to the de-bonding layer. In some embodiments, the redistribution structure 200 includes a dielectric layer 210, a redistribution conductive layer 212, and a plurality of conductive vias 214. The redistribution conductive layer 212 may be constituted by a plurality of redistribution conductive patterns. For simplicity, the dielectric layer 210 is illustrated as one single layer of dielectric layer and the redistribution conductive layer 212 is illustrated as embedded in the dielectric layer 210 in FIG. 1A. Nevertheless, from the perspective of the manufacturing process, the dielectric layer 210 is constituted by two dielectric layers and the redistribution conductive layer 212 is sandwiched between the two adjacent dielectric layers. As illustrated in FIG. 1A, the conductive vias 214 are also embedded in the dielectric layer 210. Nevertheless, top surfaces of the conductive vias 214 are exposed for future electrical connection. In other words, the exposed conductive vias 214 may serve the purpose of electrical connection with other components formed subsequently. In some embodiments, materials of the redistribution conductive layer 212 and the conductive vias 214 include aluminum, titanium, copper, nickel, tungsten, and/or alloys thereof. The redistribution conductive layer 212 may be formed by, for example, electroplating, deposition, and/or photolithography and etching. In some embodiments, the material of the dielectric layer 210 includes polyimide, epoxy resin, acrylic resin, phenol resin, benzocyclobutene (BCB), polybenzooxazole (PBO), or any other suitable polymer-based dielectric material. The dielectric layer 210, for example, may be formed by suitable fabrication techniques such as spin-on coating, chemical vapor deposition (CVD), plasma-enhanced chemical vapor deposition (PECVD), or the like. It should be noted that the number of the redistribution conductive layers 212 the number of the dielectric layers 210 illustrated in FIG. 1A are merely for illustrative purposes, and the disclosure is not limited thereto. In some alternative embodiments, more layers of the redistribution conductive layer and more layers of the dielectric layer may be formed depending on the circuit design. When more layers of redistribution conductive layer and more layers of the dielectric layer are adapted, these redistribution conductive layers and these dielectric layers are stacked alternately, and the redistribution conductive layers are interconnected with one another by the conductive vias. In some embodiments, the redistribution structure 200 is referred to as a back-side redistribution structure.

In some embodiments, the conductive structures 300 are conductive pillars formed by a photolithography process, a plating process, a photoresist stripping processes, and/or any other suitable processes. In some embodiments, the conductive structures 300 are formed on the conductive vias 214 and are in contact with the conductive vias 214 to render electrical connection with the redistribution structure 200. For example, the conductive structures 300 may be formed simultaneously with conductive vias 214 during the same stage. In some embodiments, a plurality of contact openings corresponding to the designated location of the conductive vias 214 may be formed in the dielectric layer 210. Subsequently, a mask pattern (not shown) covering the redistribution structure 200 with openings exposing the contact openings is formed. Thereafter, a metallic material is filled into the openings and the contact openings by electroplating or deposition. Then, the mask pattern is removed to obtain the conductive structures 300 and the conductive vias 214. However, the disclosure is not limited thereto. Other suitable methods may be utilized in the formation of the conductive structures 300 and the conductive vias 214. For example, the conductive structures 300 and the conductive vias 214 may be formed separately (as illustrated in FIG. 2A and FIG. 2B). In some alternative embodiments, a plurality of conductive pads (not shown) may be formed over the conductive vias 214. The conductive structures 300 are formed over the conductive pads such that the conductive structures 300 are electrically connected to the redistribution structure 200 through the conductive pads. In some embodiments, the material of the conductive structures 300 may include a metal material such as copper, copper alloys, or the like. It should be noted that only two conductive structures 300 are presented in FIG. 1B for illustrative purposes; however, more than two conductive structures 300 may be formed in some alternative embodiments. The number of the conductive structures 300 may be selected based on demand.

Figure 1B:
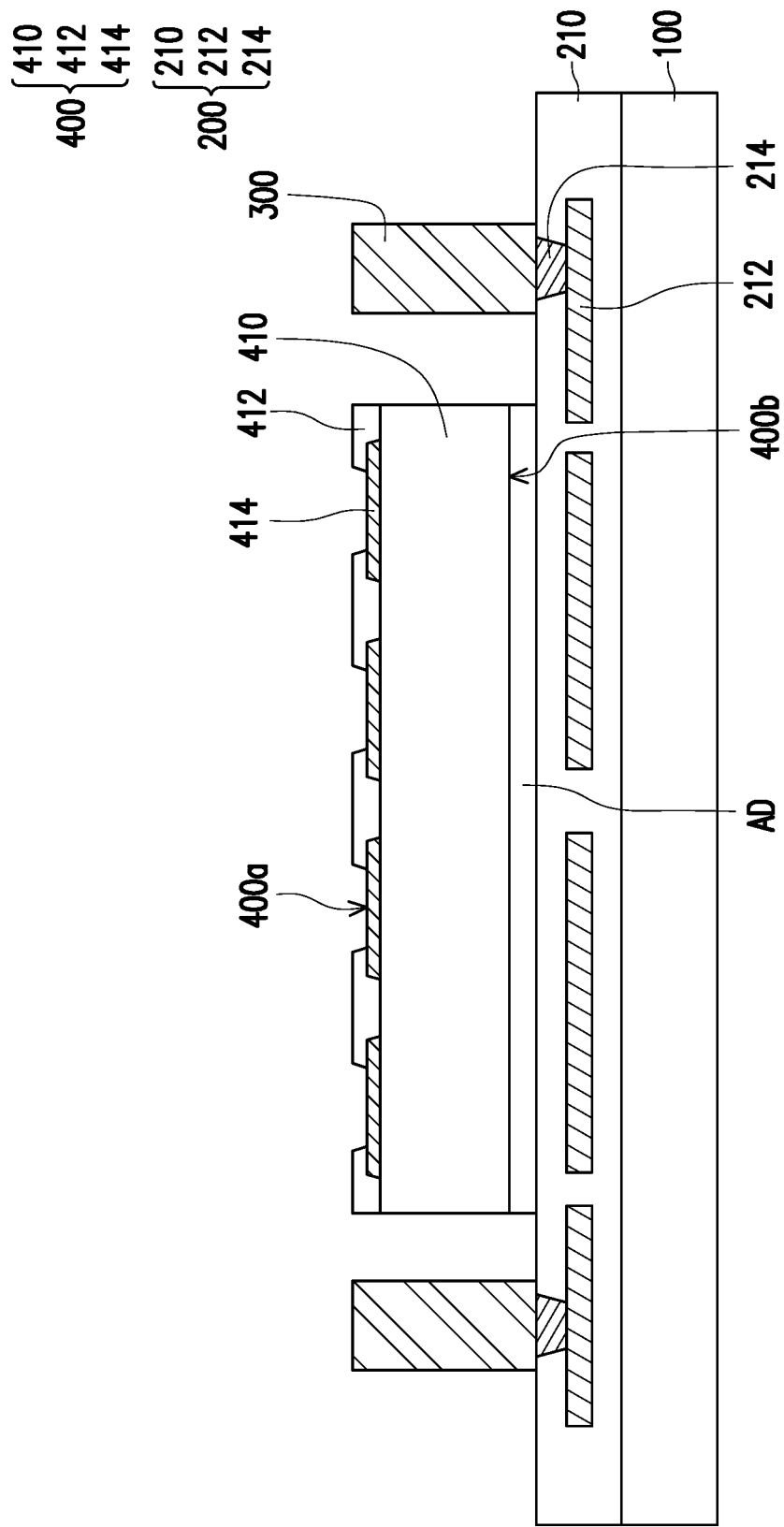
Figure 2A:
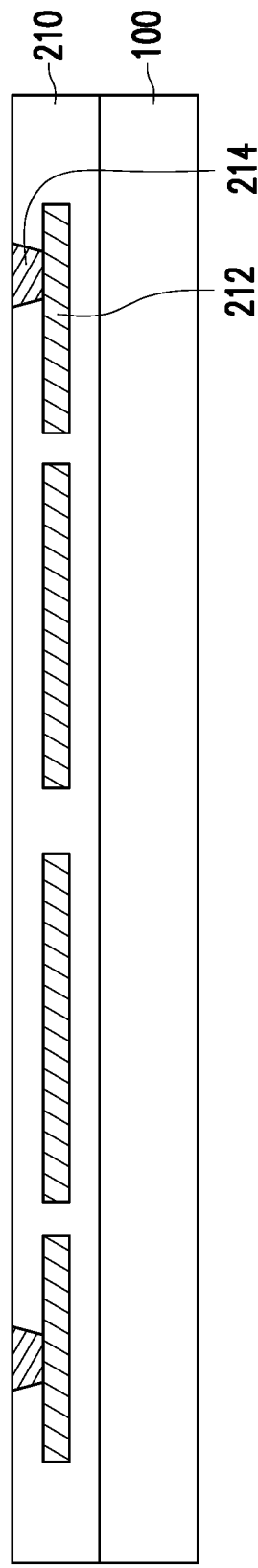
Figure 2B:
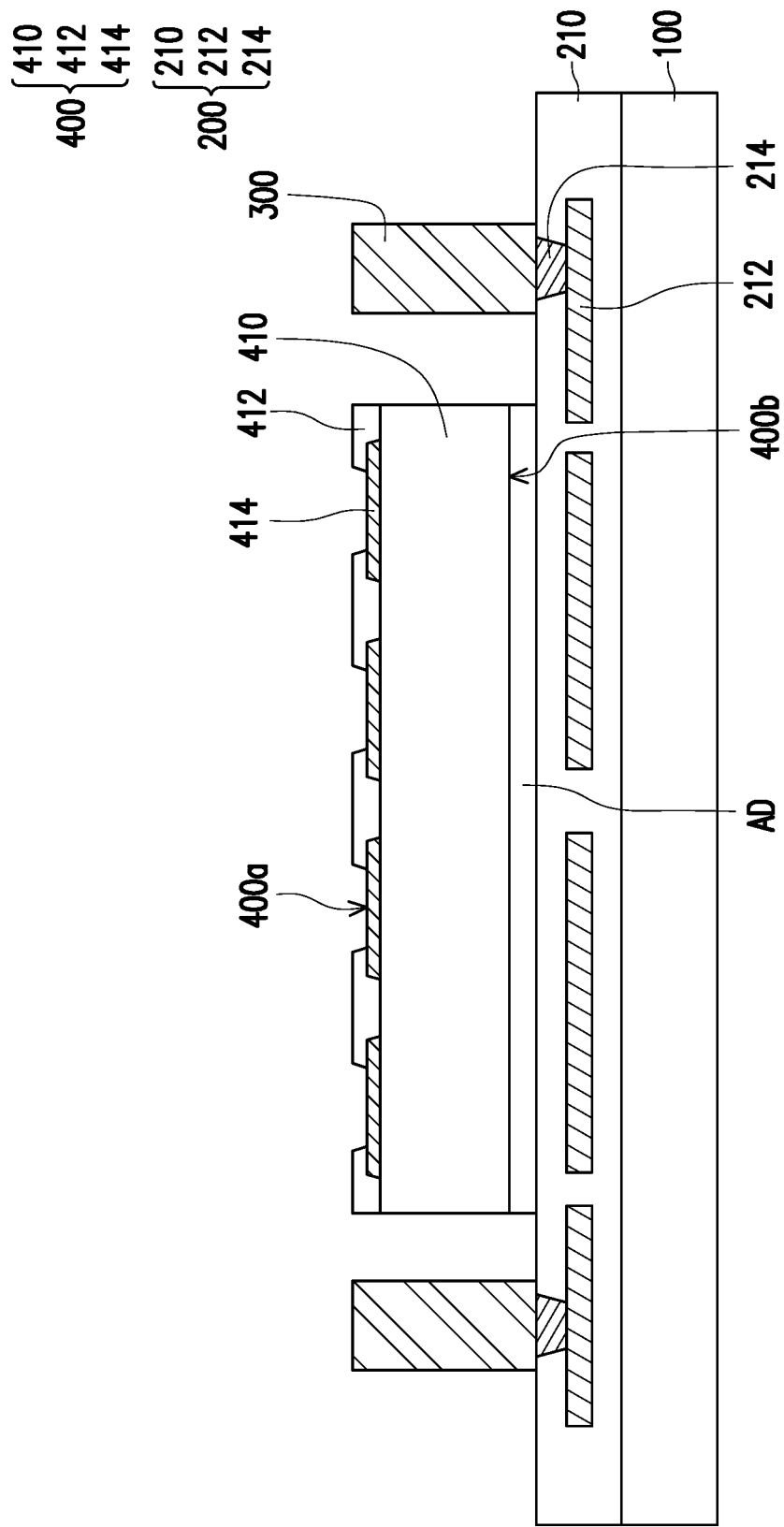
Figure 2C:
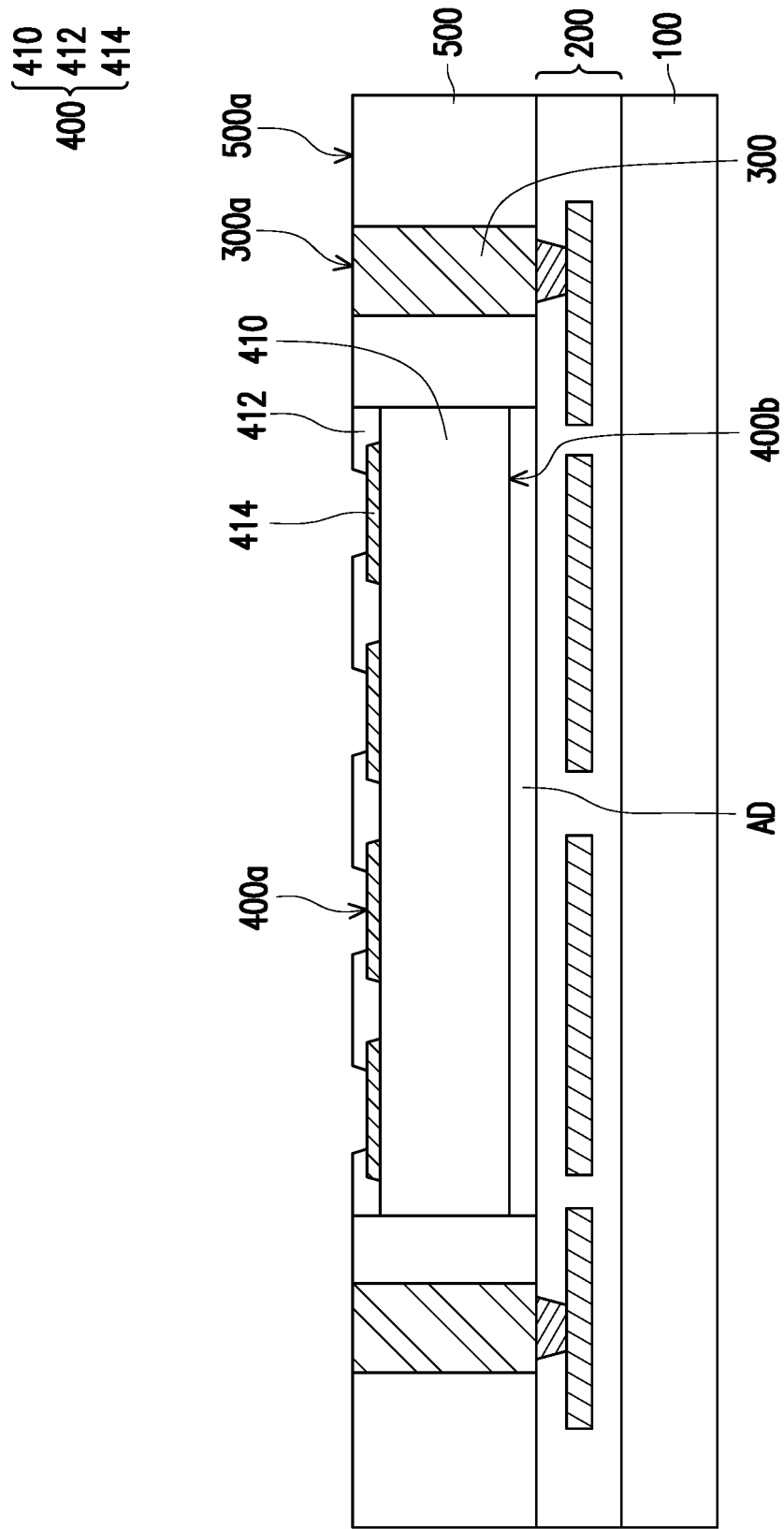
Figure 2D:
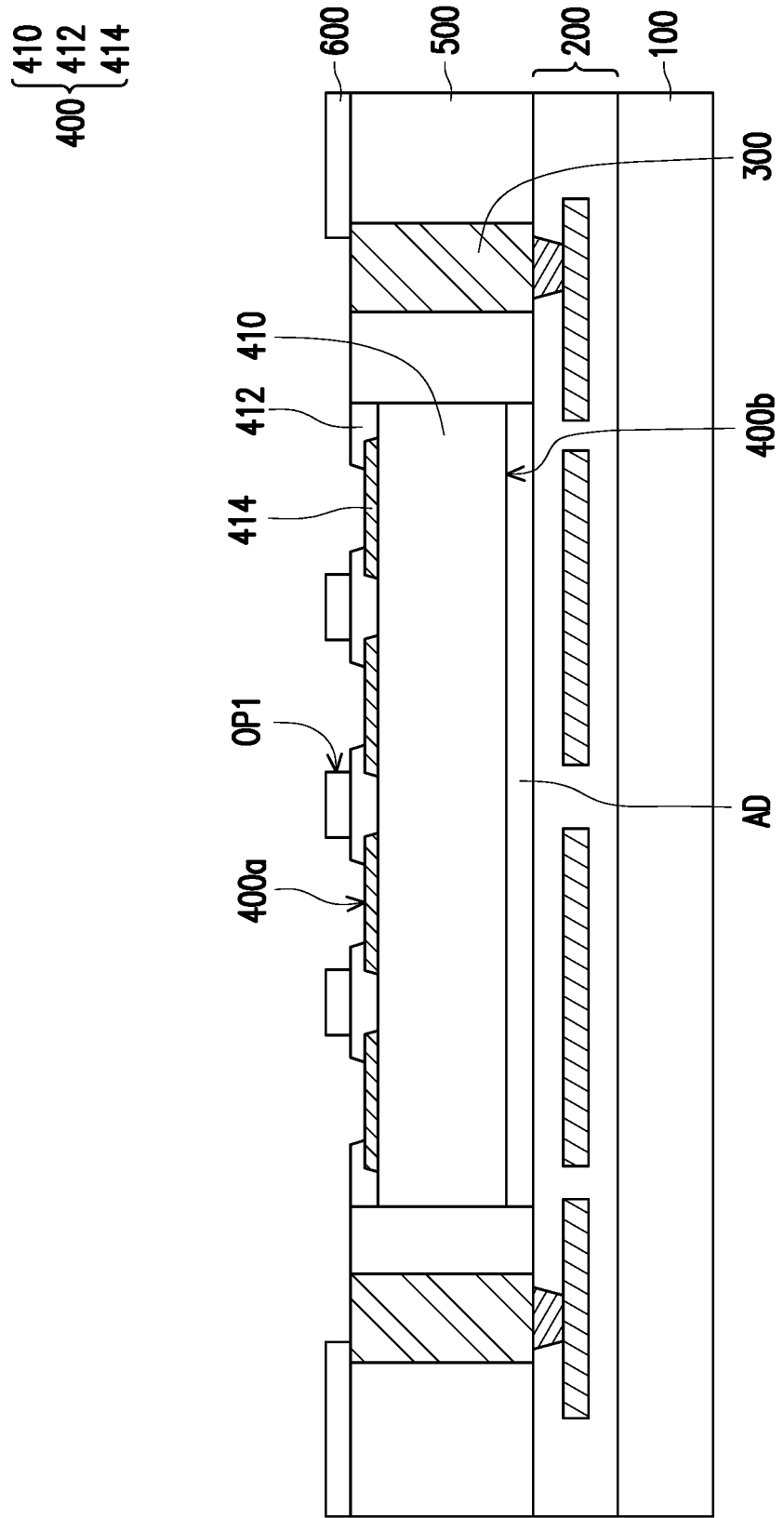

Referring to FIG. 1B, a die 400 is formed on the redistribution structure 200. In some embodiments, the die 400 is placed between conductive structures 300. For example, the conductive structures 300 may be arranged to surround the die 400. In some embodiments, the die 400 is placed onto the redistribution structure 200 through a pick-and-place method. As illustrated in FIG. 1B, the die 400 includes a semiconductor substrate 410, a plurality of connection pads 414 disposed on the semiconductor substrate 410, and a passivation layer 412 formed over the connection pads 414. In some embodiments, the semiconductor substrate 410 may be a silicon substrate including active components (e.g., transistors or the like) and optionally passive components (e.g., resistors, capacitors, inductors, or the like) formed therein. The connection pads 414 may be aluminum pads, copper pads, or other suitable metal pads. In some embodiments, the passivation layer 412 may be a polymer layer having sufficient thickness to protect the connection pads 414. In some embodiments, the material of the passivation layer 412 includes polybenzoxazole (PBO), polyimide (PI), or other suitable polymeric material. In some alternative embodiments, the passivation layer 412 may be made of inorganic materials. The passivation layer 412 exposes at least a portion of each connection pad 414 for future electrical connection. The die 400 has an active surface 400a and a rear surface 400b opposite to the active surface 400a. In some embodiments, the connection pads 414 are located on the active surface 400a of the die 400. As illustrated in FIG. 1B, the die 400 is attached to the redistribution structure 200 through an adhesive layer AD. In other words, the rear surface 400b of the die 400 is attached to the adhesive layer AD. In some embodiments, the adhesive layer AD may include a die attach film (DAF). In some embodiments, the conductive structures 300 are formed prior to the placement of the die 400.

Figure 1C:
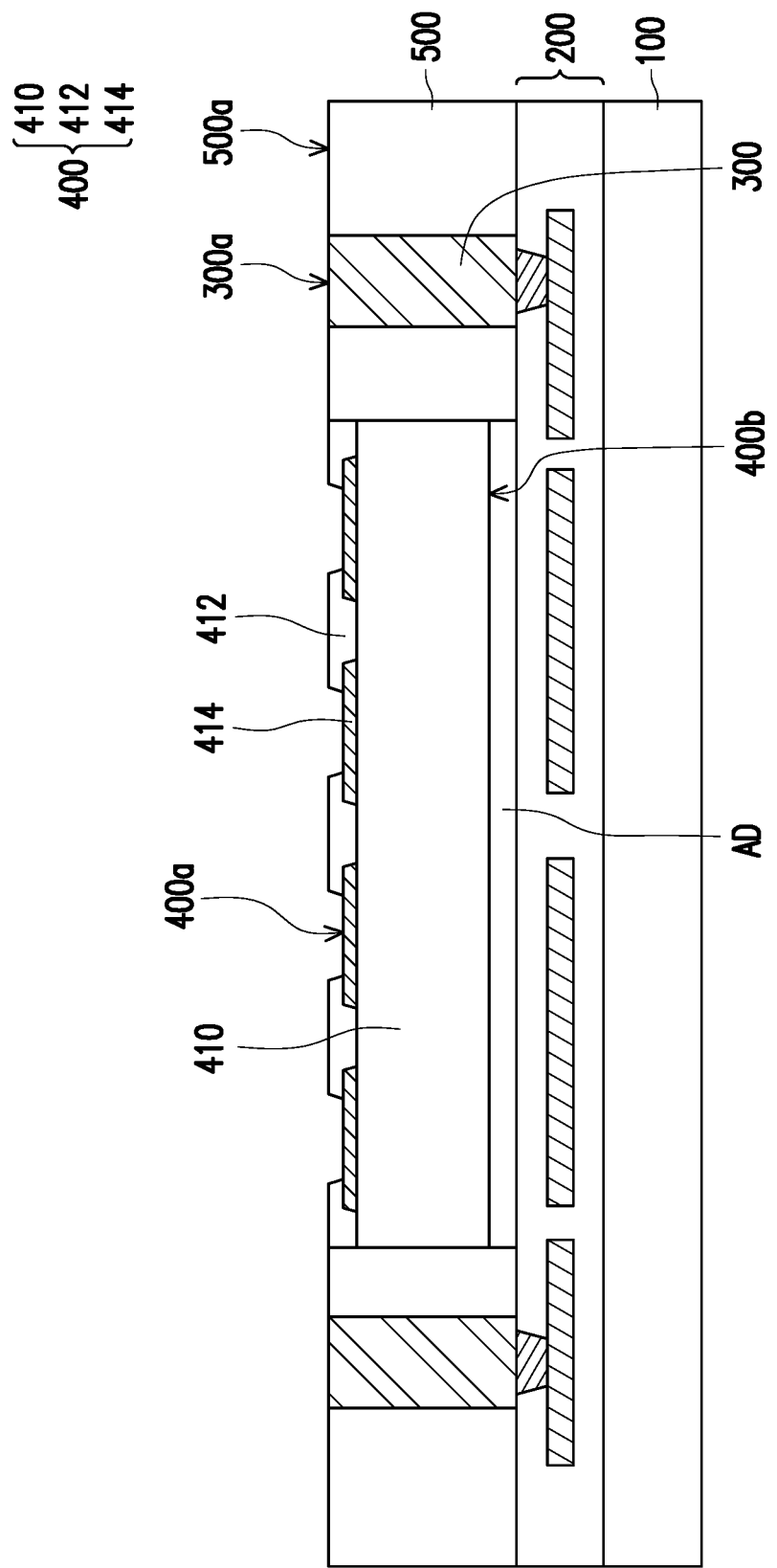

Referring to FIG. 1C, an encapsulant 500 is formed on the redistribution structure 200 to encapsulate the die 400 and the conductive structures 300. In some embodiments, the encapsulant 500 is a molding compound formed by an over-molding process. In some alternative embodiments, the material of the encapsulant 500 includes epoxy resins or other suitable resins. In some embodiments, an encapsulation material (not shown) may be initially formed to completely cover the die 400 and the conductive structures 300. Thereafter, the encapsulation material may be planarized or grinded until top surfaces of the conductive structures 300 are exposed. In some embodiments, the encapsulation material may be planarized through a mechanical grinding process, a chemical mechanical polishing (CMP) process, or any other suitable process. After the planarization or the grinding process, a patterning step may be performed on the encapsulation material to ensure the connection pads 414 of the die 400 are exposed. Thereafter, a cleaning step may be optionally performed to remove residues, thereby rendering the encapsulant 500. As illustrated in FIG. 1C, top surfaces 300a of the conductive structures 300 are coplanar with a top surface 500a of the encapsulant 500. Since the conductive structures 300 penetrate through the encapsulant 500, in some embodiments, the conductive structures 300 may be referred to as through interlayer vias (TIVs) or through integrated fan-out (InFO) vias.

Figure 1D:
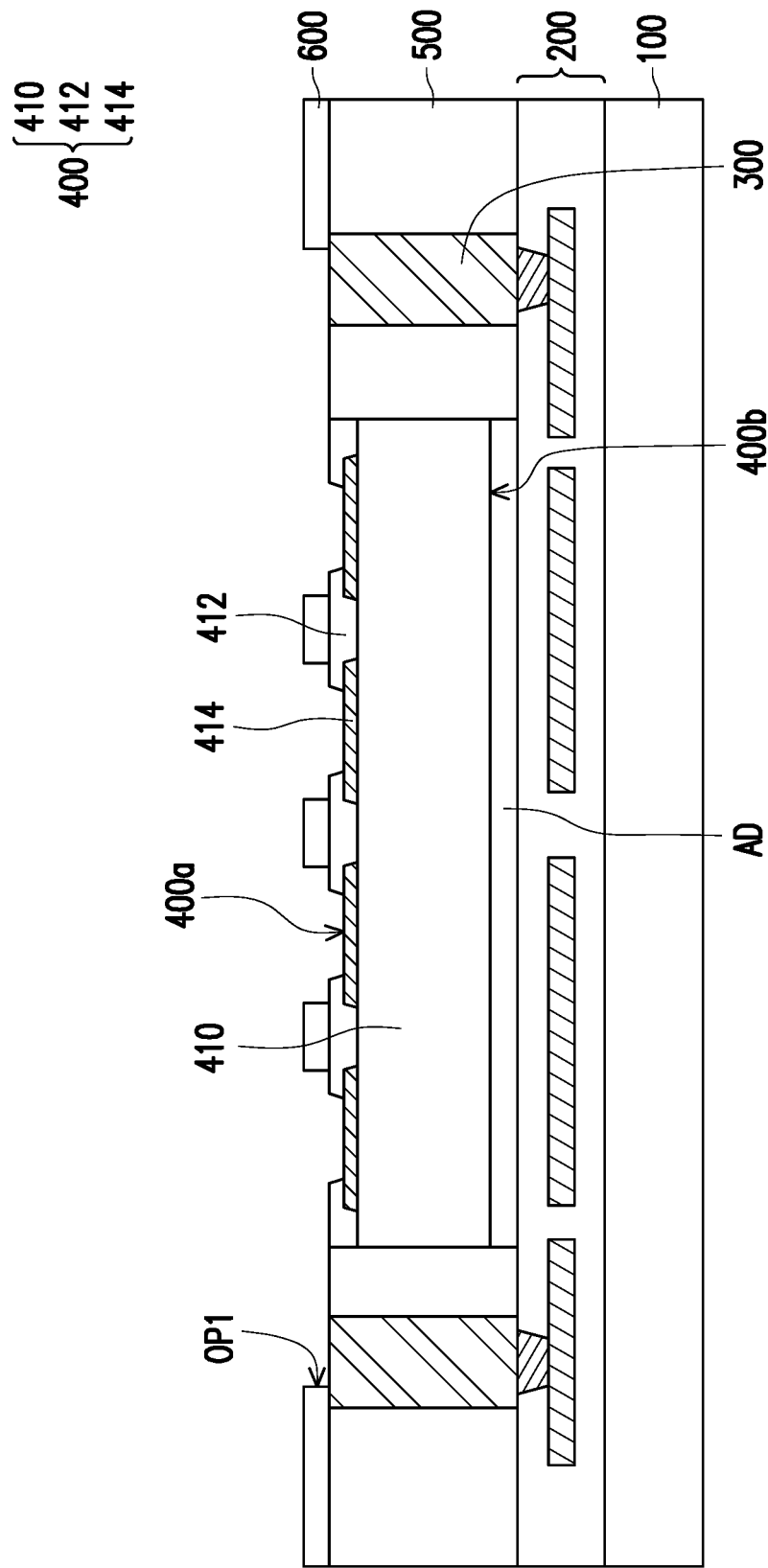

Referring to FIG. 1D, a first dielectric layer 600 is formed on the die 400, the encapsulant 500, and the conductive structures 300. The first dielectric layer 600 has a plurality of openings OP1 exposing at least a portion of the connection pads 414 of the die 400 and at least a portion of the conductive structures 300. In some embodiments, the openings OP1 may be formed by a photolithography process and an etching process. As illustrated in FIG. 1D, some of the openings OP1 may encompass a portion of one or more conductive structures 300 and one or more connection pads 414 of the die 400 simultaneously. In some embodiments, the material of the first dielectric layer 600 includes polyimide, epoxy resin, acrylic resin, phenol resin, benzocyclobutene (BCB), polybenzooxazole (PBO), or any other suitable polymer-based dielectric material. The first dielectric layer 600 may be formed by suitable fabrication techniques such as spin-on coating, chemical vapor deposition (CVD), plasma-enhanced chemical vapor deposition (PECVD), or the like.

Figure 1E:
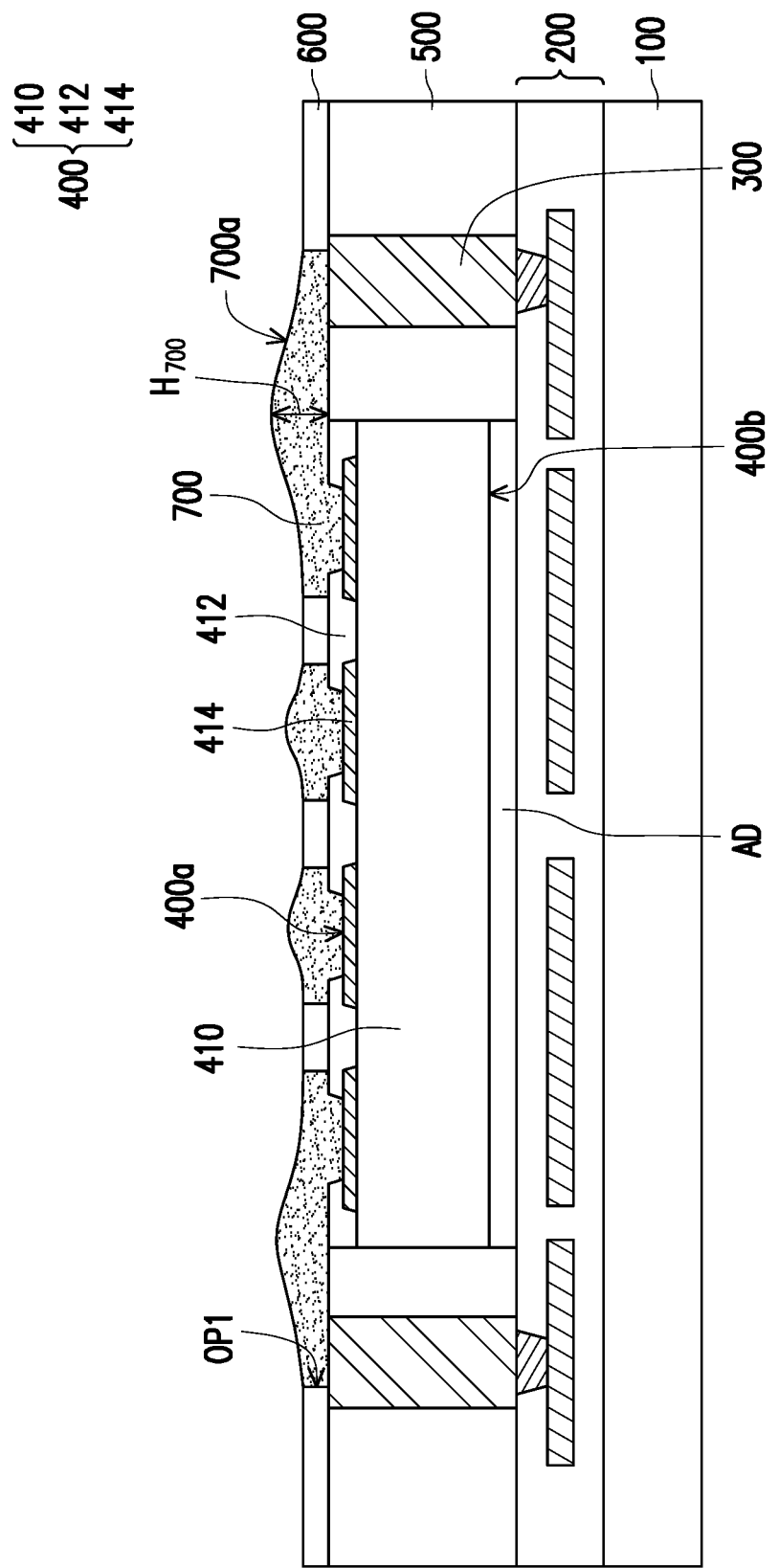

Referring to FIG. 1E, a conductive paste 700 is filled into the openings OP1 of the dielectric layer 600. The conductive paste 700 may include a copper paste, a silver paste, or any other suitable paste. In some embodiments, the conductive paste 700 may be applied onto the connection pads 414 and the conductive structures 300 by stencil printing, screen printing, a combination thereof, or any other suitable method. A stencil (not shown) with a plurality of apertures matching the openings OP1 of the first dielectric layer 600 may be disposed in contact with the first dielectric layer 600. Subsequently, the conductive paste 700 may be applied onto the stencil by a dispenser (not shown). Thereafter, a squeegee (not shown) may be adapted to scrape the conductive paste 700 into the apertures of the stencil and the openings OP1 of the first dielectric layer 600. Then, the stencil is removed. Upon removal of the stencil, the conductive paste 700 may be cured. The curing temperature may range between 125° C. and 260° C. In some embodiments, a thickness $H_{700}$ of the conductive paste 700 may range between 6 μm and 30 μm. During this stage, the top surface 700a of the cured conductive paste 700a exhibits a wavy profile, which would later affect the performance of the fingerprint sensor 10. As such, referring to FIG. 1F, the conductive paste 700 and the first dielectric layer 600 are planarized to form a plurality of conductive patterns 702 surrounded by the first dielectric layer 600. The planarization is conducted so that top surfaces 702a of the conductive patterns 702 are coplanar with a top surface 600a of the first dielectric layer 600. The planarization may be performed by fly cutting, chemical mechanical polishing, mechanical grinding, or a combination thereof. In some embodiments, a thickness $H_{702}$ of the conductive patterns 702a ranges between 2 μm and 10 μm.

Figure 1F:
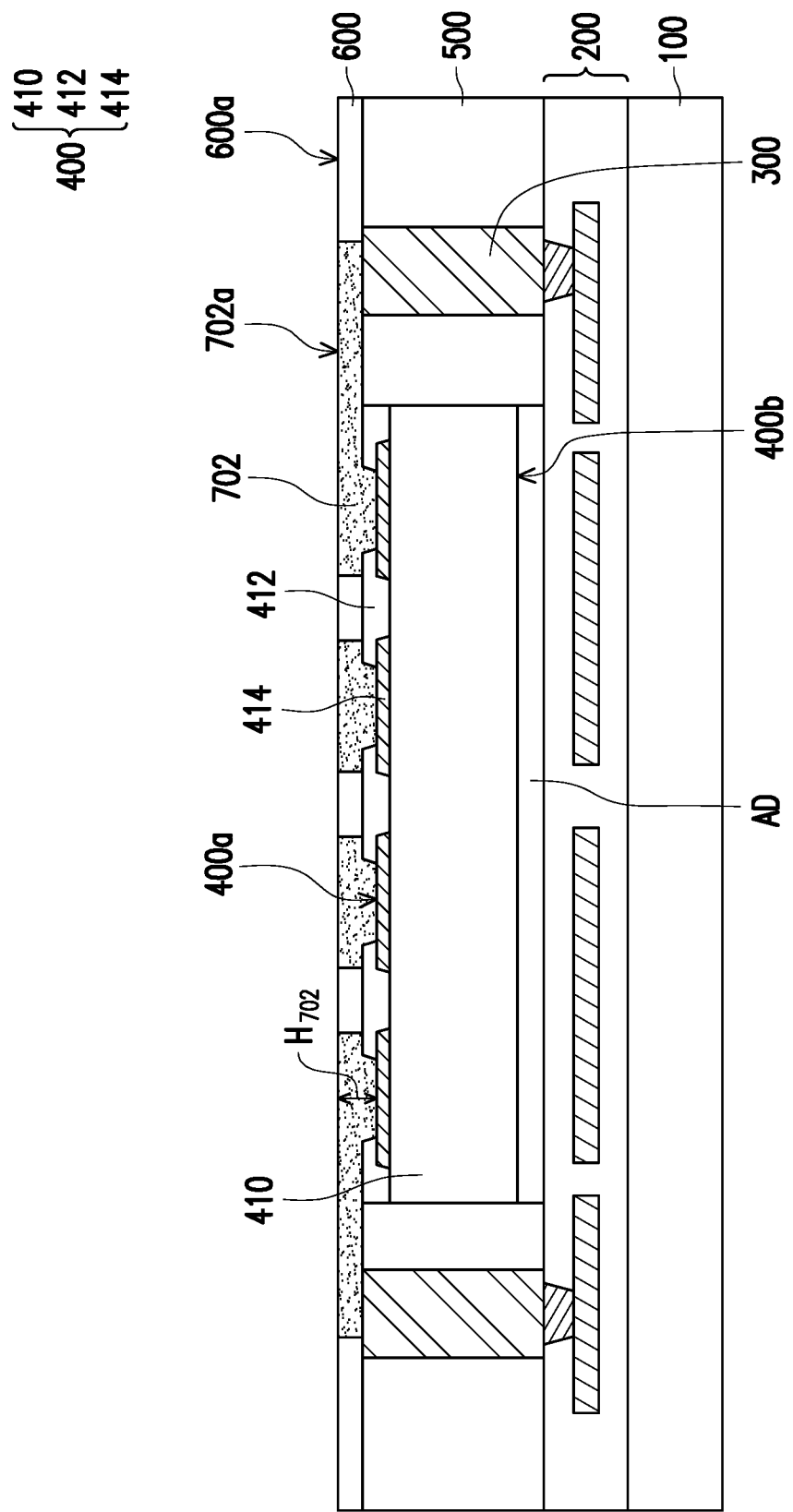

Referring to FIG. 1F, the conductive patterns 702 are directly in contact with the connection pads 414 of the die 400 and the conductive structures 300. In other words, the conductive patterns 702 are electrically connected to the die 400. On the other hand, the conductive patterns 702 are also electrically connected to the redistribution structure 200 through the conductive structures 300. In some embodiments, since the top surface 702a of the conductive patterns 702 are planarized, the top surface 702a of the conductive patterns 702 may be considered to be flat surfaces. In other words, the surfaces (top surfaces 702a) of the conductive pattern 702 parallel to the active surface 400a and the rear surface 400b of the die 400 have little or substantially no roughness. For example, a roughness of the top surfaces 702a of the conductive patterns 702 may range between 0 μm and 10 μm. In some embodiments, the top surface 702a of the conductive patterns 702 may serve as a capacitive sensing area for the fingerprint sensor 10. Since the top surfaces 702a of the conductive patterns 702 are flat surfaces, the effective sensing area is larger than the conventional fingerprint sensor, thereby allowing higher performance of the device. In addition, since the top surfaces 702a of the conductive patterns 702 are flat surfaces, harmful particles in the process chamber are unlikely to be trapped on the top surfaces 702a of the conductive patterns 702. As a result, the sensitivity of the device may be ensured. Furthermore, in some embodiments, after the conductive patterns 702 are formed, the conductive patterns 702 may be subjected to a cleaning process before the next manufacturing step is performed. The flat surface allows an easier and a more effective cleaning process.

Figure 1G:
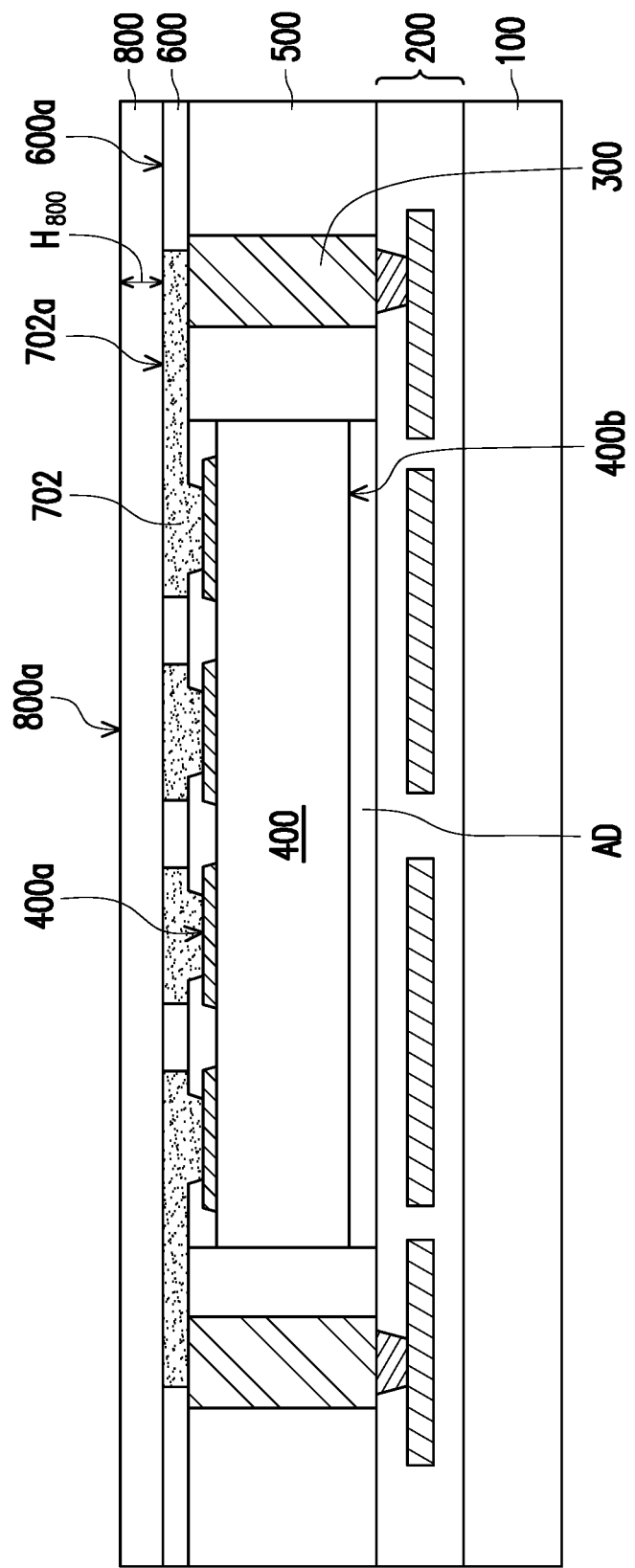

Referring to FIG. 1G, a second dielectric layer 800 is formed on the conductive patterns 702 and the first dielectric layer 600 to cover the top surfaces 702a of the conductive patterns 702 and the top surface 600a of the first dielectric layer 600. In some embodiments, the second dielectric layer 800 may have a thickness $H_{800}$ of 2 μm to 10 μm. In some embodiments, a material of the second dielectric layer 800 may be identical to the material of the first dielectric layer 600. In some alternative embodiments, the material of the second dielectric layer 800 may be different from the material of the first dielectric layer 600. For example, the material of the second dielectric layer 800 includes polyimide, epoxy resin, acrylic resin, phenol resin, benzocyclobutene (BCB), polybenzooxazole (PBO), or any other suitable polymer-based dielectric material. The second dielectric layer 800 may be formed by suitable fabrication techniques such as spin-on coating, chemical vapor deposition (CVD), plasma-enhanced chemical vapor deposition (PECVD), or the like. It should be noted that since the first dielectric layer 600 and the second dielectric layer 800 are formed during different stages of the manufacturing process, these two layers may be considered as two distinct layers. Since the second dielectric layer 800 is formed on a substantially flat surface (the top surface 600a of the first dielectric layer 600 and the top surfaces 702a of the conductive patterns 702), a top surface 800a of the second dielectric layer 800 is also a substantially flat surface. For example, a roughness of the top surfaces 800a of the second dielectric layer 800 may be less than 1 μm. In some embodiments, the flatness of the top surface 600a of the first dielectric layer 600 and the top surfaces 702a of the conductive patterns 702 provides a better platform to accommodate the second dielectric layer 800, thereby avoiding delamination issues of the second dielectric layer 800. In some embodiments, the conductive pattern 702, the first dielectric layer 600, and the second dielectric layer 800 may constitute a front-side redistribution structure. It should be noted that since the front-side redistribution structure act as a capacitive sensing layer of the fingerprint sensor 10, only one single layer of the conductive patterns 702 is formed in the front-side redistribution structure.

Figure 1H:
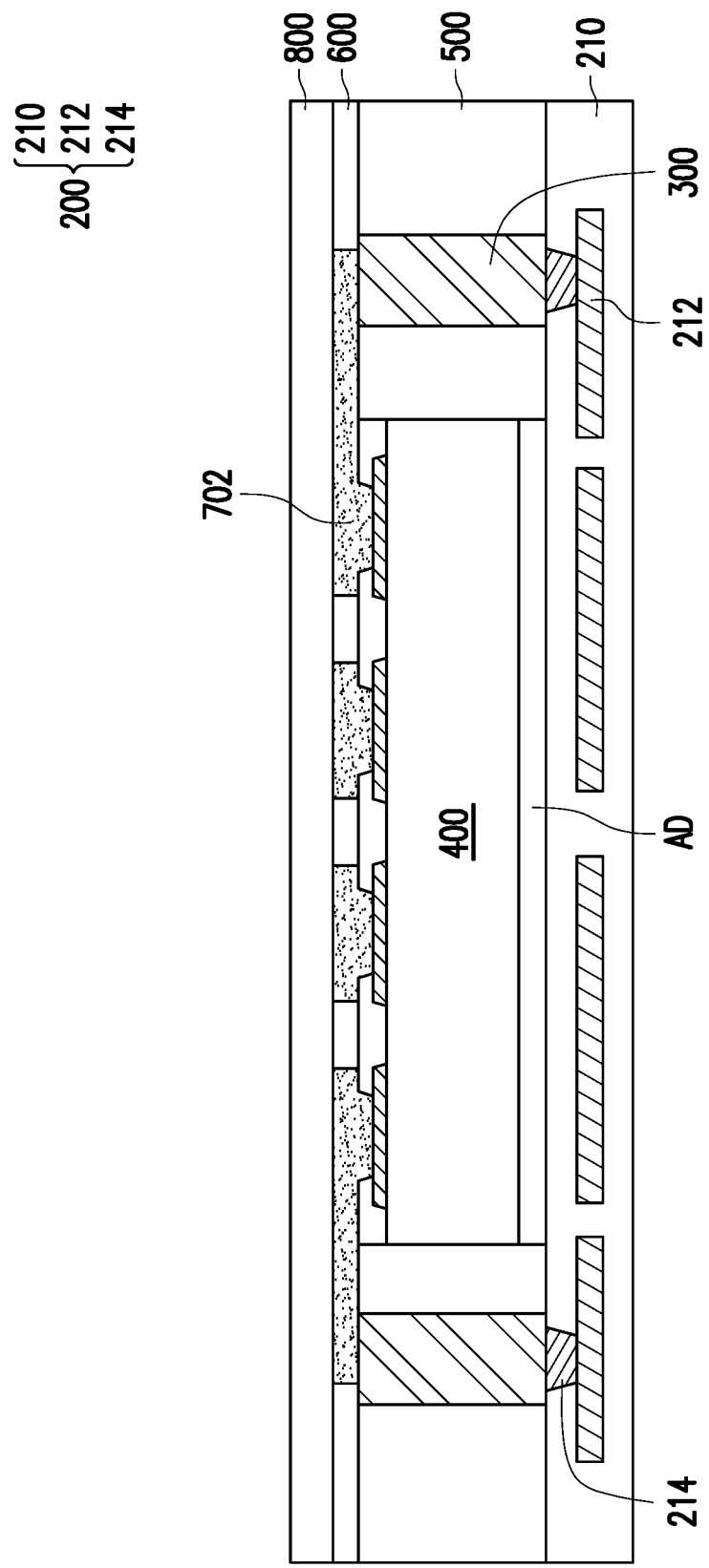

Referring to FIG. 1H, the redistribution structure 200 is separated from the carrier 100. For example, the carrier 100 may be separated from the redistribution structure 200 such that the dielectric layer 210 of the redistribution structure 200 is exposed. As mentioned above, in some embodiments, the de-bonding layer (not shown) is a LTHC release layer. Upon irradiation with an UV laser, the de-bonding layer and the carrier 100 may be peeled off and removed. Nevertheless, the de-bonding process is not limited thereto. Other suitable de-carrier methods may be used in some alternative embodiments.

Figure 1I:
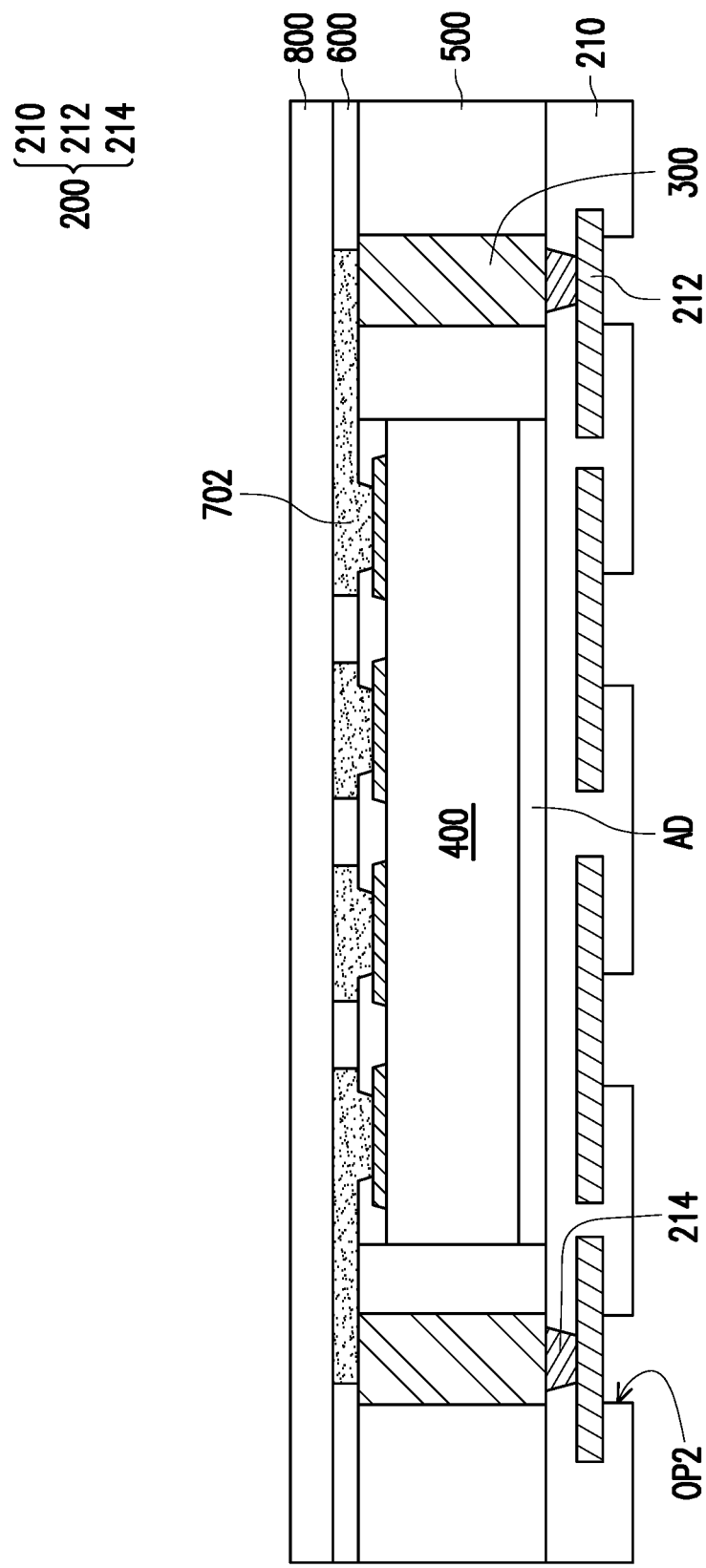

Referring to FIG. 1I, after removing the carrier 100, a plurality of contact openings OP2 is formed in the dielectric layer 210 to partially expose the redistribution conductive layer 212. In some embodiments, when multiple redistribution conductive layers 212 are present, the contact openings OP2 expose the bottommost conductive layer 212. In some embodiments, the contact openings OP2 are formed by a laser drilling process, a mechanical drilling process, a photolithography process, or other suitable processes.

Figure 1J:
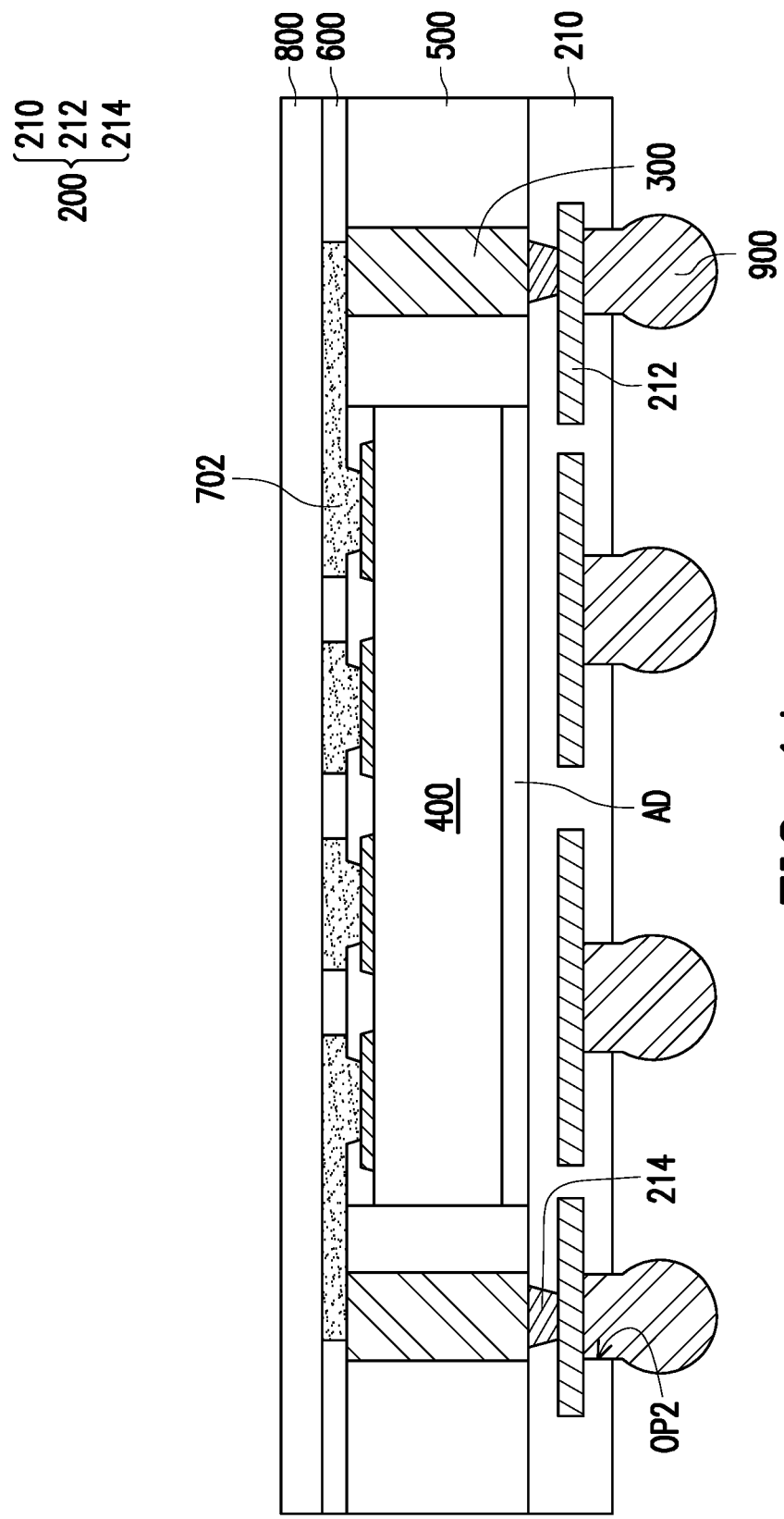

Referring to FIG. 1J, a plurality of conductive terminals 900 is formed over the redistribution structure 200. In some embodiments, at least part of the conductive terminals 900 extends into the contact openings OP2 to be in contact with the redistribution conductive layer 212, thereby rendering electrical connection with the redistribution structure 200. In some embodiments, the conductive terminals 900 are attached to the redistribution conductive layer 212 through a solder flux (not shown). In some embodiments, the conductive terminals 900 are, for example, solder balls. In some embodiments, the conductive terminals 900 may be disposed on the redistribution conductive layer 212 by a ball placement process and/or a reflow process.

Figure 1K:
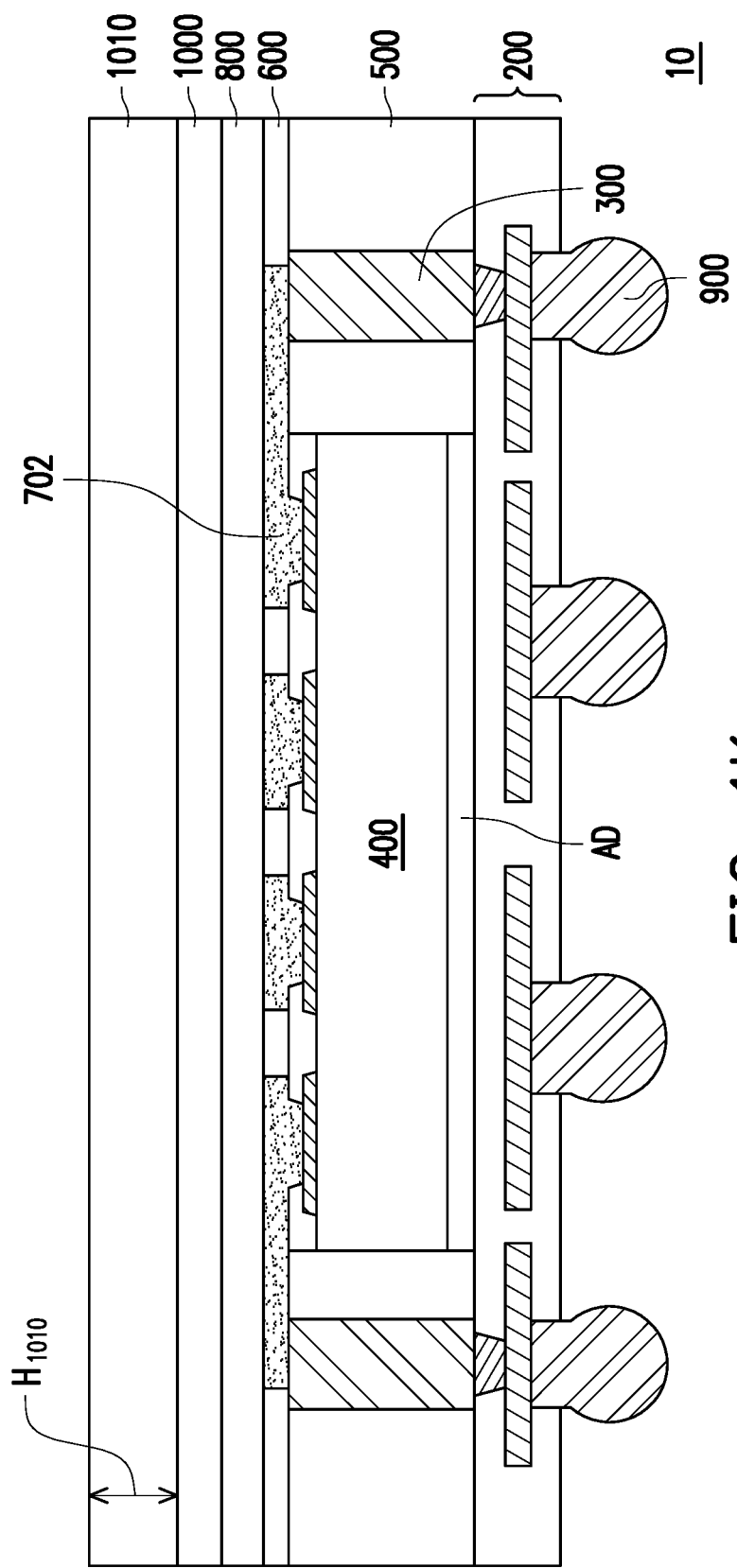

Referring to FIG. 1K, an adhesive layer 1000 and a cover 1010 are sequentially formed on the second dielectric layer 800 to obtain the fingerprint sensor 10. As mentioned above, the top surface 800a of the second dielectric layer 800 is a substantially flat surface. The flatness of such surface is able to suppress the generation of voids within the adhesive layer 1000 during the formation step thereof. In some embodiments, the cover 1010 may be made of sapphire, glass, or any other suitable transparent material. In some alternative embodiments, the cover 1010 may include a color film formed by a coating process. In some embodiments, the cover 1010 may have a thickness Him in a range of 100 μm to 200 μm.

FIG. 2A to FIG. 2M are cross-sectional views illustrating various stages of a method of manufacturing a fingerprint sensor 20 in accordance with some alternative embodiments of the disclosure.

Figure 2E:
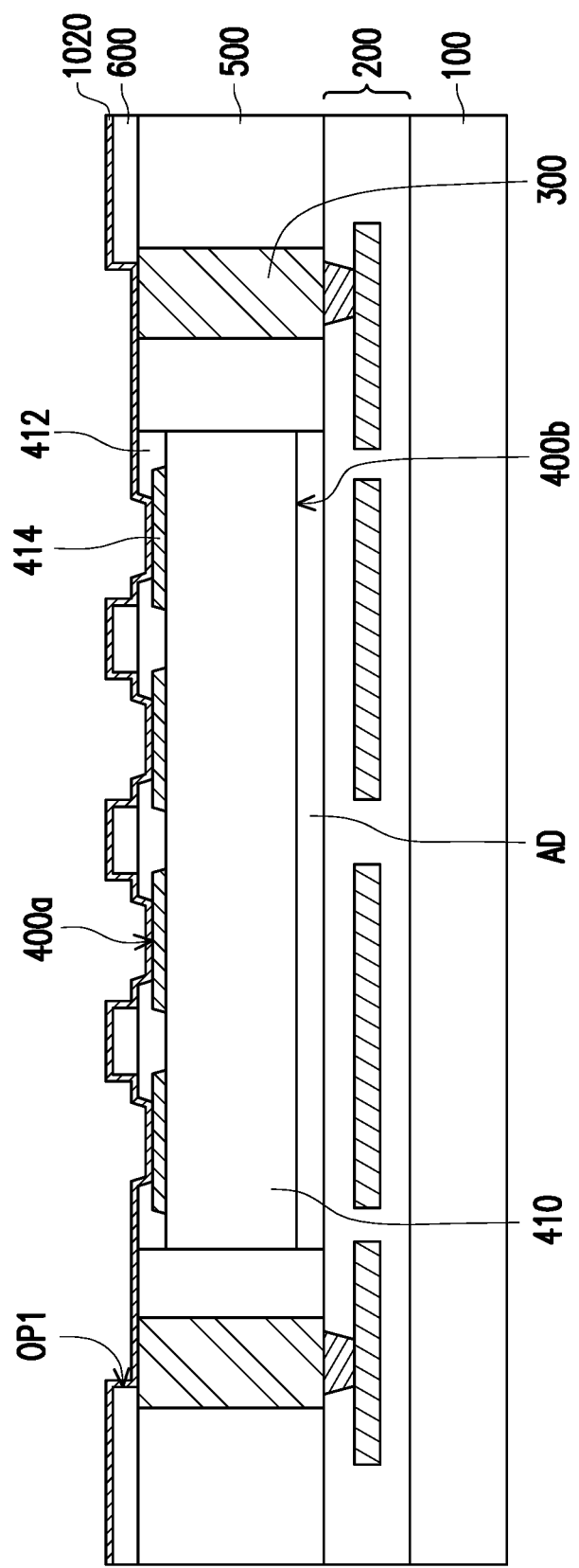

Referring to FIG. 2A to FIG. 2D, the steps illustrated in FIG. 2A to FIG. 2D are similar to the steps illustrated in FIG. 1A to FIG. 1D, so similar elements are denoted by the same reference numeral and the detailed descriptions thereof are omitted herein. Referring to FIG. 2E, a seed material layer 1020 is formed to cover the first dielectric layer 600 and the openings OP1 of the first dielectric layer 600. As illustrated in FIG. 2E, the seed material layer 1020 is formed in a conformal manner covering the profile of the openings OP1 of the first dielectric layer 600. That is, the seed material layer 1020 extends into the openings OP1 to cover a bottom surface and sidewalls of the openings OP1, thereby to be in contact with the conductive structures 300 and the connection pads 414. In some embodiments, the seed material layer 1020 may be formed through, for example, a sputtering process, a physical vapor deposition (PVD) process, or the like. In some embodiments, the seed material layer 1020 may include, for example, copper, titanium-copper alloy, or other suitable materials.

Figure 2F:
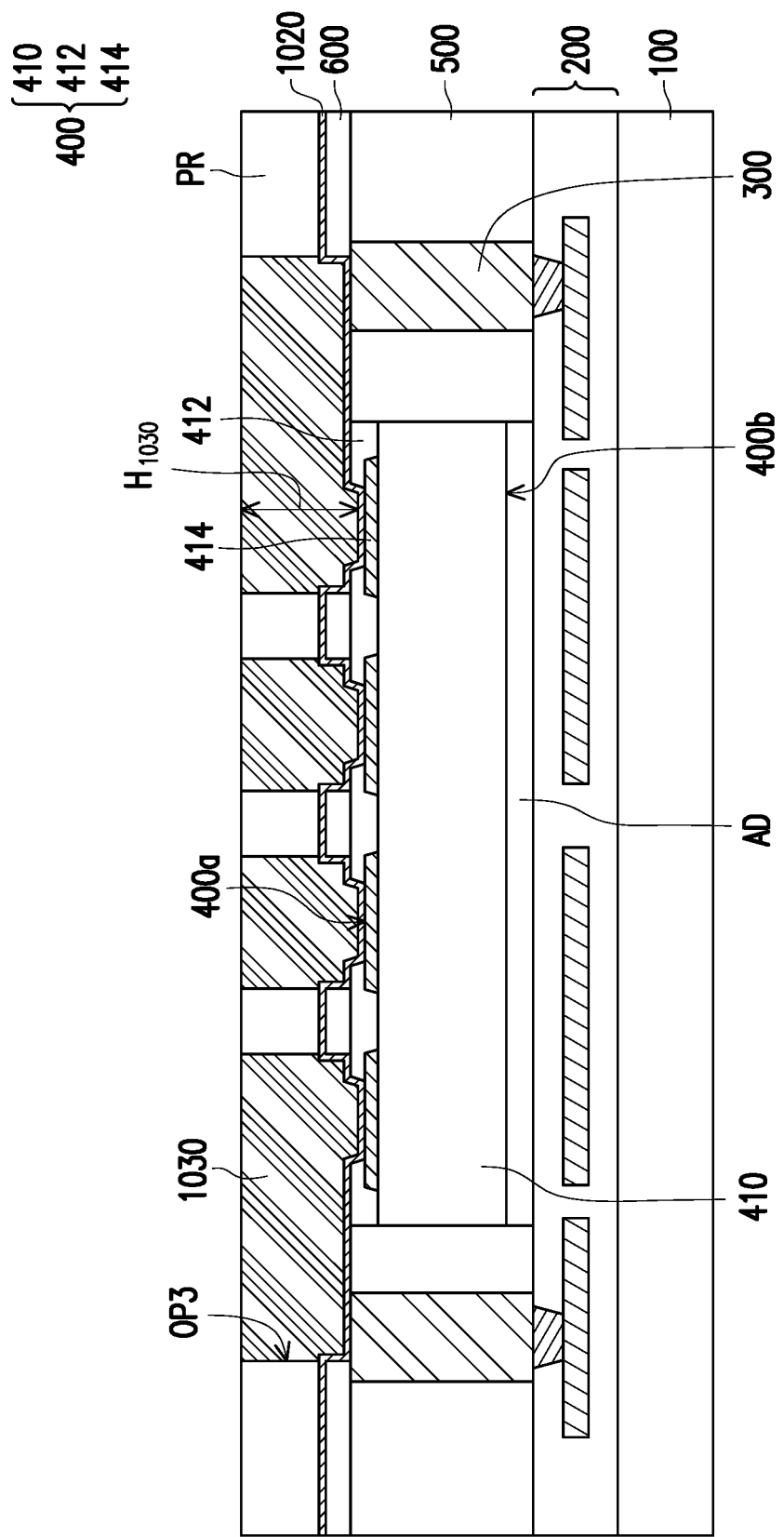

Referring to FIG. 2F, a photoresist layer PR is formed over the seed material layer 1020 on a region corresponding to the first dielectric layer 600. For example, the photoresist layer PR may have a plurality of openings OP3 corresponding to the openings OP1 of the first dielectric layer 600. In other words, the portion of the seed material layer 1020 exposed by the photoresist layer PR is the portion deposited on the bottom surface and sidewalls of the openings OP1 of the first dielectric layer 600. Subsequently, a conductive material layer 1030 is filled into the openings OP3 of the photoresist layer PR. In some embodiments, a material of the conductive material layer 1030 includes aluminum, titanium, copper, nickel, tungsten, and/or alloys thereof. The conductive material layer 1030 may be formed by a plating process. The plating process includes electro-plating, electroless-plating, immersion plating, or a combination thereof. It should be noted that the conductive material layer 1030 is formed to a thickness $H_{1030}$ of 3 μm to 100 μm, so the conductive material layer 1030 is not deposited in a conformal manner.

Figure 2G:
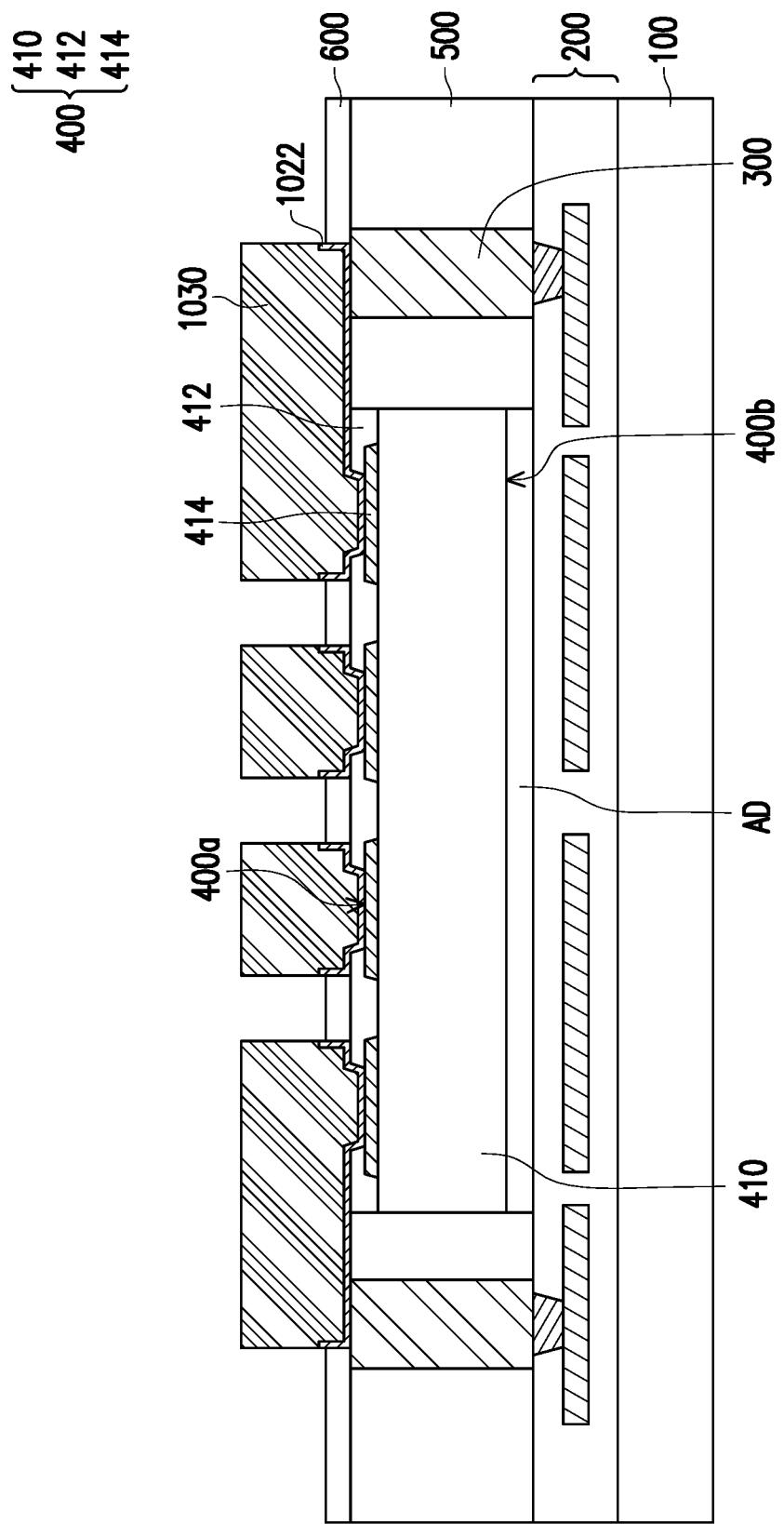

Referring to FIG. 2G, the photoresist layer PR is removed by, for example, etching, ashing, or other suitable processes. The portions of the seed material layer 1020 exposed by the conductive material layer 1030 upon removal of the photoresist layer PR are then removed to render a seed layer 1022 covered by (underneath) the conductive material layer 1030. The exposed portions of the seed material layer 1020 may be removed through an etching process. In some embodiments, the material of the conductive material layer 1030 may be different from the material of the seed material layer 1020, so that the exposed portion of the seed layer 1020 may be removed through selective etching.

Figure 2H:
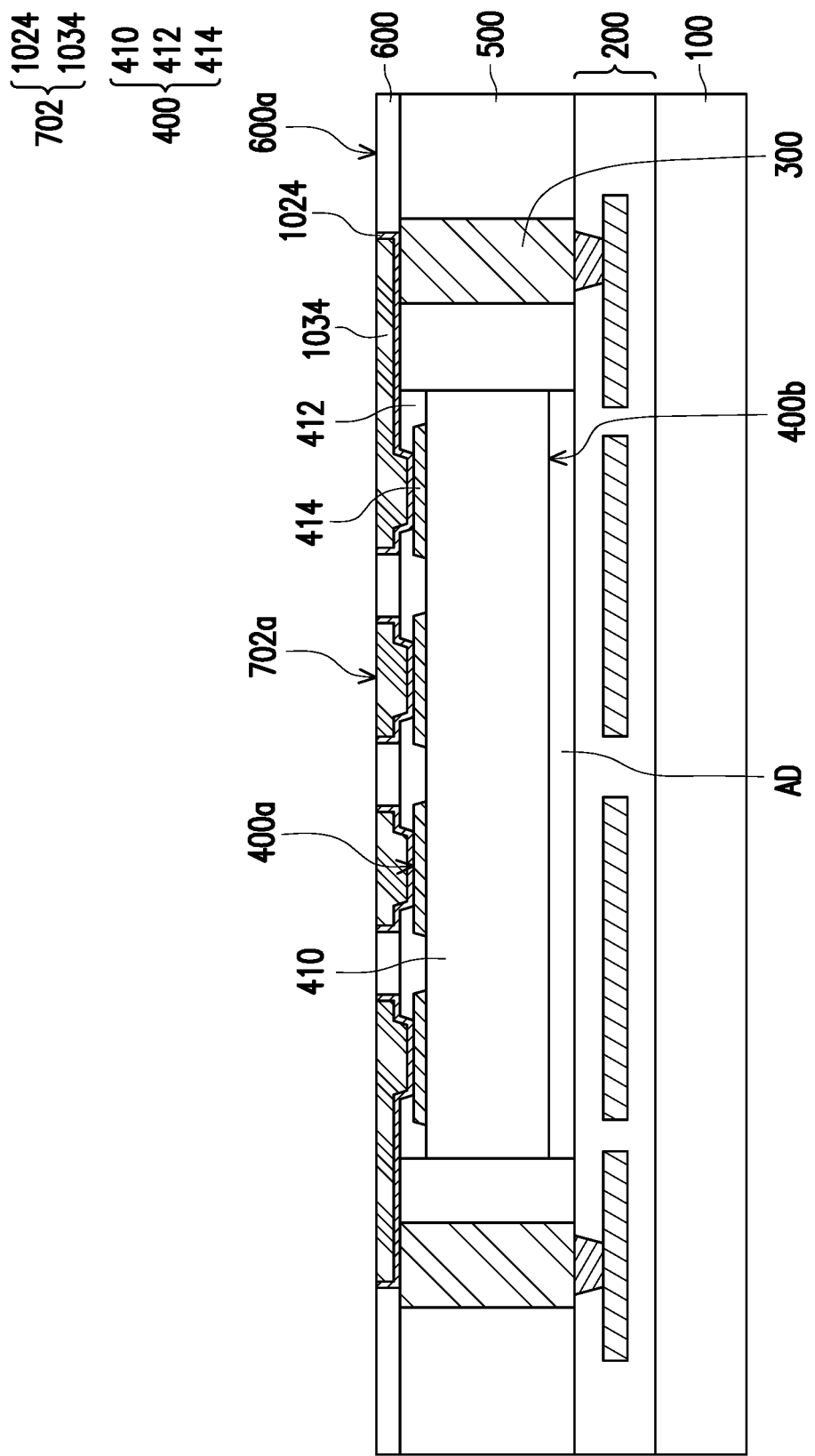
Figure 21:
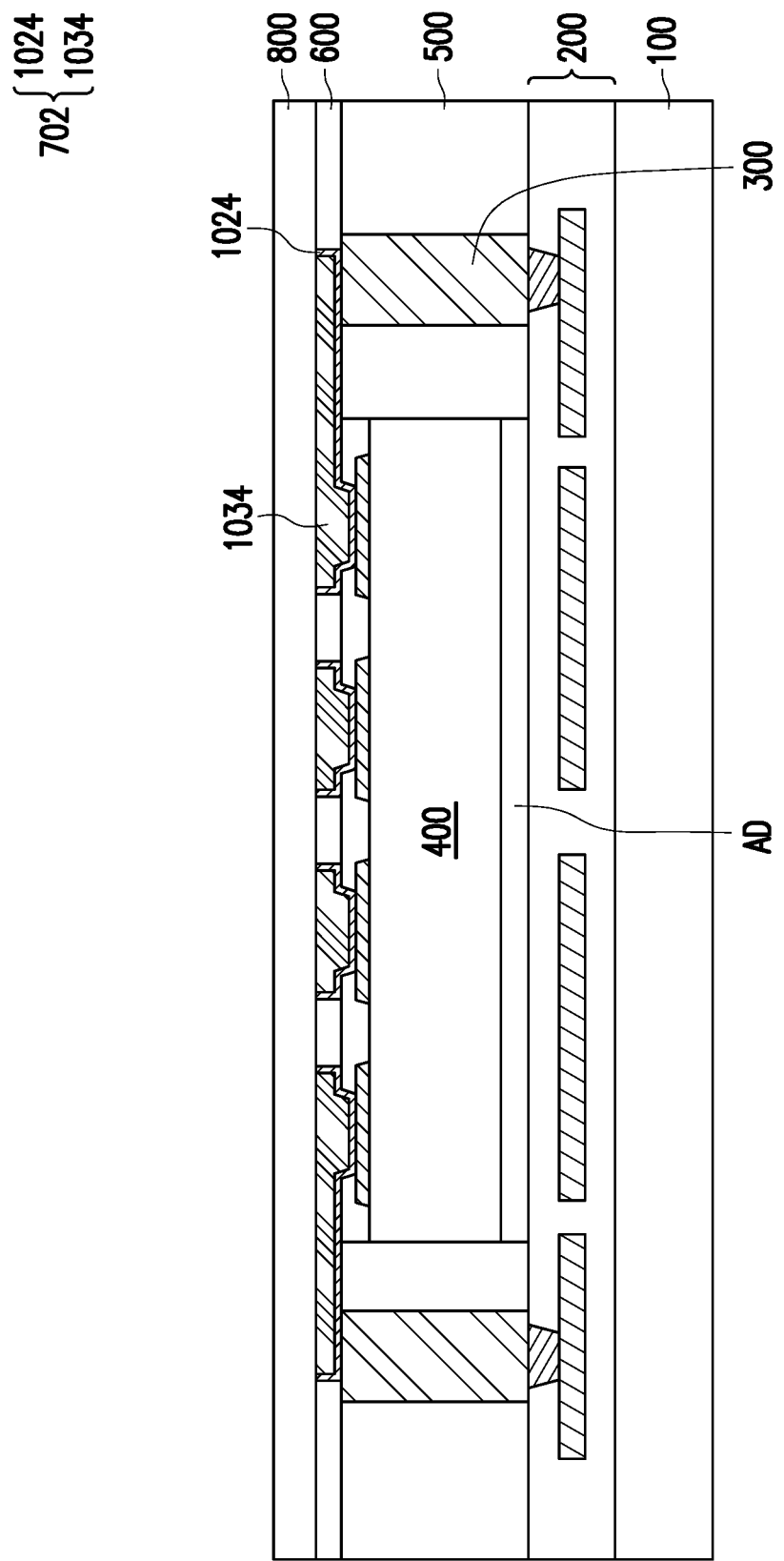
Figure 2J:
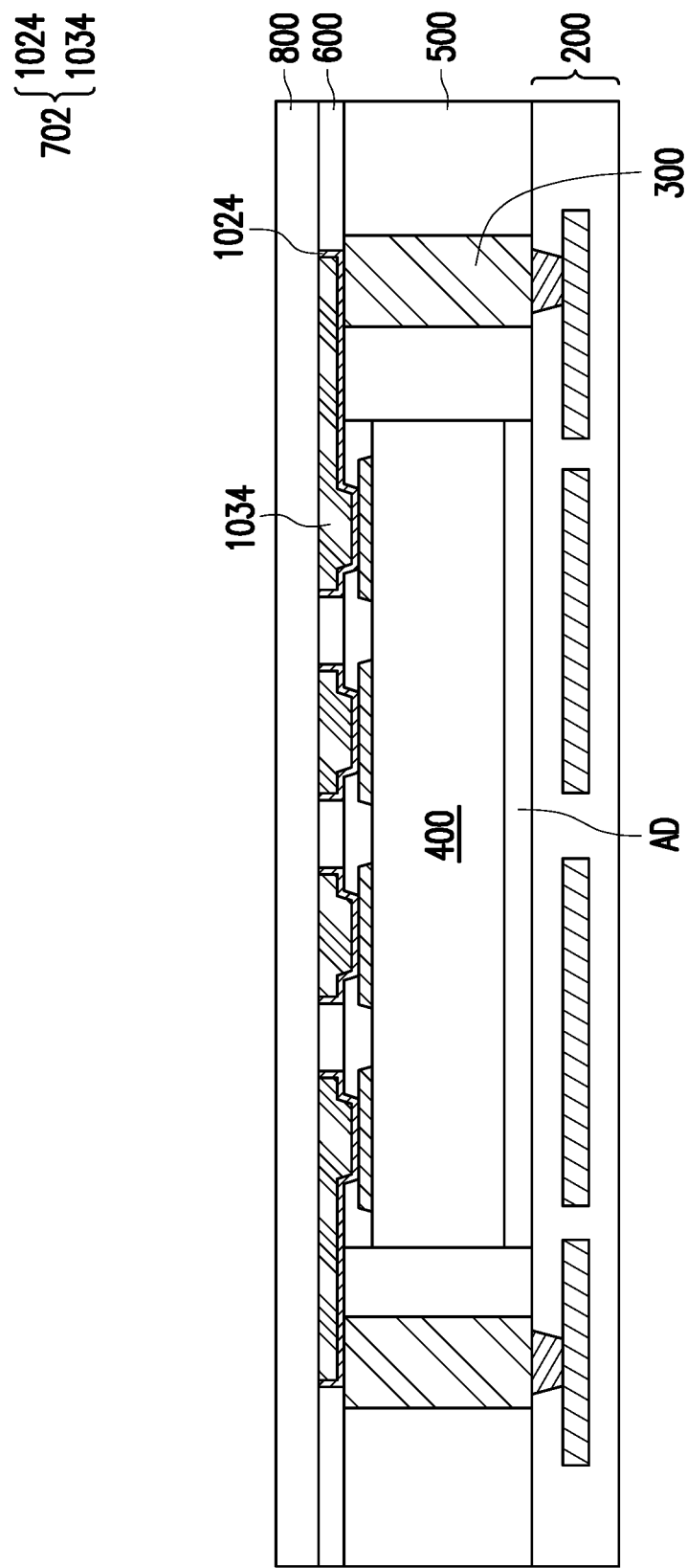
Figure 2K:
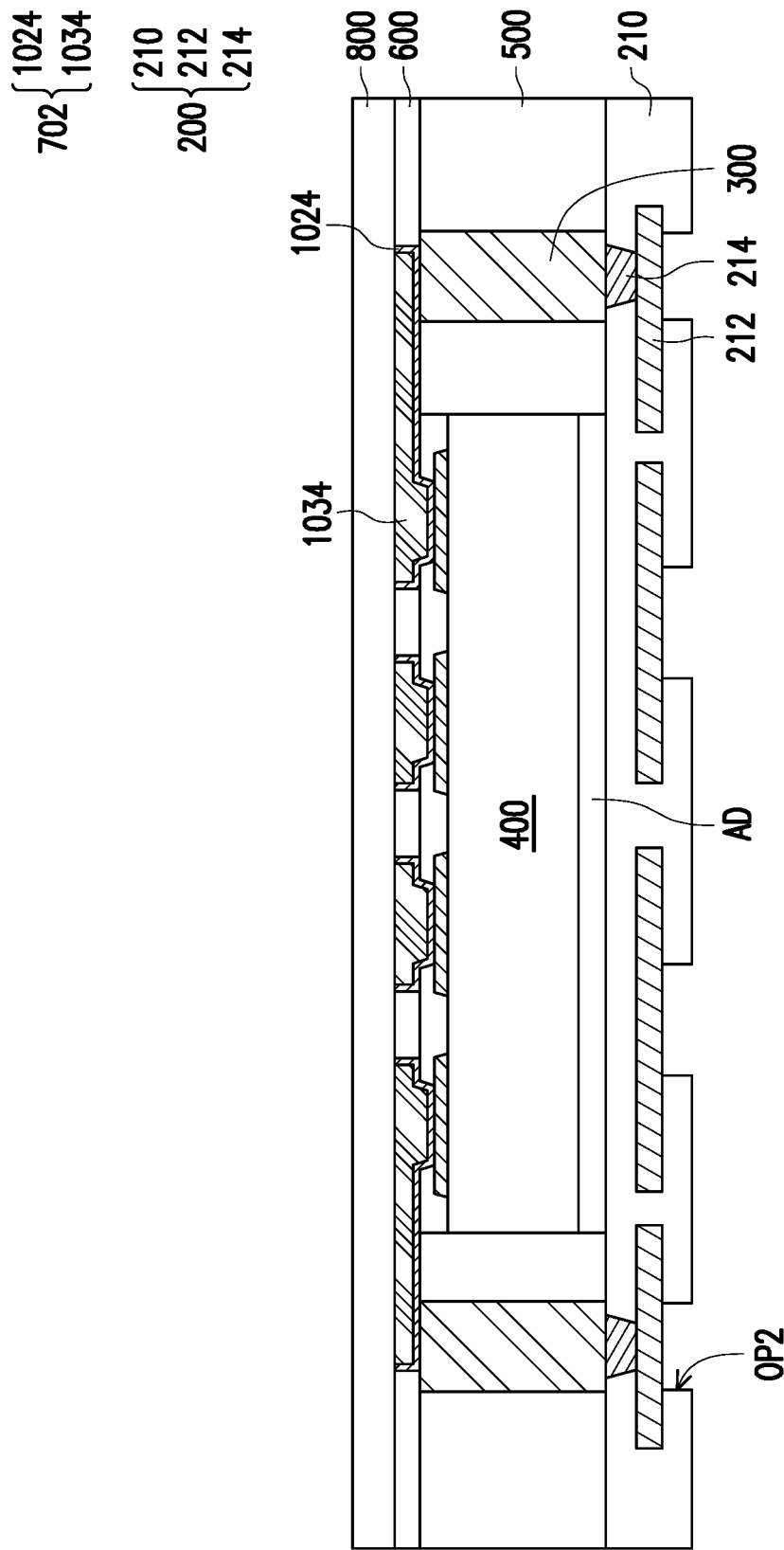
Figure 2L:
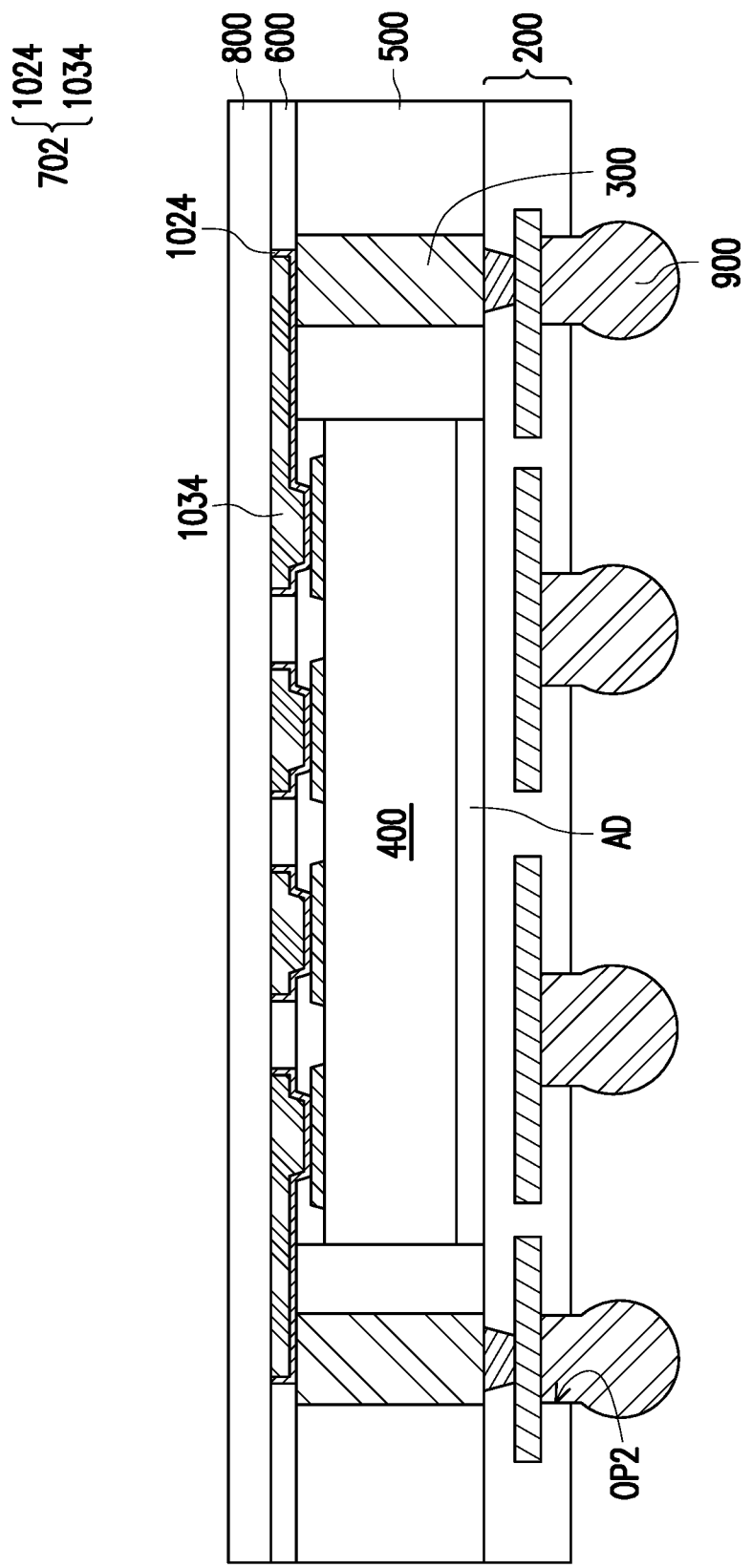

Referring to FIG. 2H, the conductive material layer 1030, the seed layer 1022, and the first dielectric layer 600 are planarized to form a seed layer 1024 and a conductive layer 1034 surrounded by the first dielectric layer 600. In some embodiments, the seed layer 1024 and the conductive layer 1034 may be collectively referred to as conductive patterns 702. The planarization is conducted so that top surfaces 702a of the conductive patterns 702 are coplanar with a top surface 600a of the first dielectric layer 600. The planarization may be performed by fly cutting, chemical mechanical polishing, mechanical grinding, or a combination thereof. Referring to FIG. 2H, the seed layer 1024 is directly in contact with the connection pads 414 of the die 400 and the conductive structures 300. In other words, the conductive patterns 702 are electrically connected to the conductive structures 300 and the die 400. In some embodiments, since the top surface 702a of the conductive patterns 702 are planarized, the top surface 702a of the conductive patterns 702 may be considered to be flat surfaces. In other words, the surfaces (top surface 702a) of the conductive pattern 702 parallel to the active surface 400a and rear surface 400b of the die 400 have little or substantially no roughness. For example, a roughness of the top surfaces 702a of the conductive patterns 702 may range between 0 μm and 10 μm. In some embodiments, the top surface 702a of the conductive patterns 702 may serve as a capacitive sensing area for the fingerprint sensor 20. Since the top surfaces 702a of the conductive patterns 702 are flat surfaces, the effective sensing area is larger than the conventional fingerprint sensor, thereby allowing higher performance of the device. In addition, since the top surfaces 702a of the conductive patterns 702 are flat surfaces, harmful particles in the process chamber are unlikely to be trapped on the top surfaces 702a of the conductive patterns 702. As a result, the sensitivity of the device may be ensured. Furthermore, in some embodiments, after the conductive patterns 702 are formed, the conductive patterns 702 may be subjected to a cleaning process before the next manufacturing step is performed. The flat surface allows an easier and a more effective cleaning process.

Referring to FIG. 2I to FIG. 2M, the steps illustrated in FIG. 2I to FIG. 2M are similar to the steps illustrated in FIG. 1G to FIG. 1K, so similar elements are denoted by the same reference numeral and the detailed descriptions thereof are omitted herein.

In accordance with some embodiments of the disclosure, a fingerprint sensor includes a die, a plurality of conductive structures, an encapsulant, a plurality of conductive patterns, a first dielectric layer, a second dielectric layer, and a redistribution structures. The die has an active surface and a rear surface opposite to the active surface. The conductive structures surround the die. The encapsulant encapsulates the die and the conductive structures. The conductive patterns are over the die. The conductive patterns are electrically connected to the die and the conductive structures. Top surfaces of the conductive patterns are flat. The first dielectric layer is over the die and the encapsulant. A top surface of the first dielectric layer is coplanar with top surfaces of the conductive patterns. The second dielectric layer covers the first dielectric layer and the conductive patterns. The redistribution structure is over the rear surface of the die.

In accordance with some embodiments of the disclosure, a manufacturing method of a fingerprint sensor includes at least the following steps. A redistribution structure is provided. A die and a plurality of conductive structures are formed over the redistribution structure. The die includes a plurality of connection pads. The die and the conductive structures are encapsulated by an encapsulant. A first dielectric layer is formed over the die, the encapsulant, and the conductive structures. The first dielectric layer includes a plurality of openings exposing at least a portion of the connection pads and at least a portion of the conductive structures. A conductive paste is filled into the openings. The conductive paste and the first dielectric layer are planarized to form a plurality of conductive patterns surrounded by the first dielectric layer. Top surfaces of the conductive patterns are coplanar with a top surface of the first dielectric layer. A second dielectric layer is formed to cover the top surface of the first dielectric layer and the top surfaces of the conductive patterns.

In accordance with some alternative embodiments of the disclosure, a manufacturing method of a fingerprint sensor includes at least the following steps. A redistribution structure is provided. A die and a plurality of conductive structures are formed over the redistribution structure. The die includes a plurality of connection pads. The die and the conductive structures are encapsulated by an encapsulant. A first dielectric layer is formed over the die, the encapsulant, and the conductive structures. The first dielectric layer includes a plurality of openings exposing at least a portion of the connection pads and at least a portion of the conductive structures. A seed layer is formed in the openings. A conductive material layer is formed over the seed layer. The conductive material layer, the seed layer, and the first dielectric layer are planarized to form a plurality of conductive patterns surrounded by the first dielectric layer. Top surfaces of the conductive patterns are coplanar with a top surface of the first dielectric layer. A second dielectric layer is formed to cover the top surface of the first dielectric layer and the top surfaces of the conductive patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fingerprint sensor, comprising:
a die;
an encapsulant encapsulating the die;
a plurality of conductive patterns over and electrically connected to the die;
a first dielectric layer over the die and the encapsulant to laterally encapsulate the plurality of conductive patterns, wherein a minimum thickness of the plurality of conductive patterns is equal to a thickness of the first dielectric layer; and
a second dielectric layer covering the first dielectric layer and the plurality of conductive patterns.

2. The fingerprint sensor according to claim 1, wherein the die comprises:
a semiconductor substrate;
a plurality of connection pads disposed on the semiconductor substrate; and
a passivation layer over the plurality of connection pads, wherein the passivation layer has a plurality of openings, and the plurality of conductive patterns extends into the plurality of openings to be in direct contact with the plurality of connection pads.

3. The fingerprint sensor according to claim 2, wherein each of the plurality of connection pads has a first portion and a second portion connected to the first portion, the first portion is located within the plurality of openings of the passivation layer, and the second portion is over the passivation layer and the encapsulant, and the minimum thickness of the plurality of conductive patterns is a thickness of the second portion.

4. The fingerprint sensor according to claim 1, wherein top surfaces of the plurality of conductive patterns are flat.

5. The fingerprint sensor according to claim 4, wherein a roughness of the top surfaces of the plurality of conductive patterns ranges between 0 μm and 10 μm.

6. The fingerprint sensor according to claim 1, further comprising:
a cover over the second dielectric layer; and
an adhesive layer between the cover and the second dielectric layer.

7. The fingerprint sensor according to claim 1, wherein a top surface of the second dielectric layer is substantially flat.

8. A fingerprint sensor, comprising:
a die, having an active surface and a rear surface opposite to the active surface;
a plurality of conductive structures surrounding the die;
an encapsulant encapsulating the die and the plurality of conductive structures;
a plurality of conductive patterns over the die, wherein the plurality of conductive patterns are electrically connected to the die and the plurality of conductive structures, and top surfaces of the plurality of conductive patterns are flat;
a first dielectric layer over the die and the encapsulant, wherein a top surface of the first dielectric layer is coplanar with the top surfaces of the plurality of conductive patterns, and a minimum thickness of the plurality of conductive patterns is equal to a thickness of the first dielectric layer;
a second dielectric layer covering the first dielectric layer and the plurality of conductive patterns; and
a redistribution structure over the rear surface of the die.

9. The fingerprint sensor according to claim 8, further comprising a plurality of conductive terminals over the redistribution structure.

10. The fingerprint sensor according to claim 8, further comprising:
a cover over the second dielectric layer; and
an adhesive layer between the cover and the second dielectric layer.

11. The fingerprint sensor according to claim 8, wherein a roughness of the top surfaces of the plurality of conductive patterns ranges between 0 μm and 10 μm.

12. The fingerprint sensor according to claim 8, wherein a top surface of the second dielectric layer is substantially flat.

13. The fingerprint sensor according to claim 12, wherein a roughness of the top surface of the second dielectric layer is less than 1 μm.

14. The fingerprint sensor according to claim 8, wherein a thickness of the plurality of conductive patterns ranges between 2 μm and 10 μm.

15. A fingerprint sensor, comprising:
a die;
an encapsulant encapsulating the die;
a plurality of conductive patterns over and electrically connected to the die, wherein top surfaces of the plurality of conductive patterns are flat, and each of the plurality of conductive patterns comprises a seed layer and a conductive layer disposed on the seed layer;

a first dielectric layer over the die and the encapsulant, wherein a top surface of the first dielectric layer is coplanar with the top surfaces of the plurality of conductive patterns, and a portion of the seed layer is sandwiched between the conductive layer and the first dielectric layer, and a minimum thickness of the plurality of conductive patterns is equal to a thickness of the first dielectric layer; and a second dielectric layer covering the first dielectric layer and the plurality of conductive patterns.

16. The fingerprint sensor according to claim 15, wherein the seed layer covers a bottom surface and sidewalls of the conductive layer.

17. The fingerprint sensor according to claim 15, wherein a surface of the seed layer, a top surface of the conductive layer, and a top surface of the first dielectric layer are coplanar.

18. The fingerprint sensor according to claim 15, further comprising:

a plurality of conductive structures penetrating through the encapsulant and surrounding the die, wherein the seed layer of the plurality of conductive patterns is directly in contact with the plurality of conductive structures; and a redistribution structure disposed over the die opposite to the plurality of conductive patterns, wherein the redistribution structure is electrically connected to the plurality of conductive structures.

19. The fingerprint sensor according to claim 15, wherein a top surface of the second dielectric layer is substantially flat.

20. The fingerprint sensor according to claim 15, wherein a roughness of the top surfaces of the plurality of conductive patterns ranges between 0 μm and 10 μm.

* * * * *